United States Patent
Salamon et al.

(10) Patent No.: US 12,203,706 B2
(45) Date of Patent: Jan. 21, 2025

(54) INTEGRATED HEAT SPREADER

(71) Applicant: Nokia Technologies Oy, Espoo (FI)

(72) Inventors: Todd Salamon, New Providence, NJ (US); Nagesh Basavanhally, Skillman, NJ (US); Flavio Pardo, Glen Gardner, NJ (US)

(73) Assignee: Nokia Technologies Oy, Espoo (FI)

( * ) Notice: Subject to any disclaimer, the term of this patent is extended or adjusted under 35 U.S.C. 154(b) by 143 days.

(21) Appl. No.: 17/838,332

(22) Filed: Jun. 13, 2022

(65) Prior Publication Data
US 2022/0412662 A1 Dec. 29, 2022

(30) Foreign Application Priority Data

Jun. 25, 2021 (EP) .................................... 21181869

(51) Int. Cl.
*F28D 15/02* (2006.01)
*F28F 1/10* (2006.01)
*H01S 5/024* (2006.01)

(52) U.S. Cl.
CPC ............ *F28D 15/0208* (2013.01); *F28F 1/10* (2013.01); *H01S 5/02415* (2013.01); *H01S 5/02469* (2013.01); *F28D 2015/0225* (2013.01); *F28F 2210/10* (2013.01)

(58) Field of Classification Search
CPC ............... F28D 15/0233; F28D 15/046; H01S 5/02469; H01S 5/02415
See application file for complete search history.

(56) References Cited

U.S. PATENT DOCUMENTS

| | | |
|---|---|---|
| 4,901,324 A | 2/1990 | Martin |
| 6,973,106 B1 | 12/2005 | Chaoui |
| 2003/0142712 A1 | 7/2003 | Ikeda et al. |
| 2010/0309940 A1 | 12/2010 | Lee |
| 2013/0044776 A1 | 2/2013 | Schlie et al. |
| 2021/0104863 A1 | 4/2021 | Amalfi et al. |

FOREIGN PATENT DOCUMENTS

| | | | |
|---|---|---|---|
| EP | 3336471 A1 | * | 6/2018 |
| JP | 4486785 B2 | | 6/2010 |
| JP | 2018112358 A | * | 7/2018 |

* cited by examiner

*Primary Examiner* — Eric S Ruppert
(74) *Attorney, Agent, or Firm* — Harrington & Smith

(57) ABSTRACT

A device, and method of operating the device, are disclosed. The device includes: a heat spreader having a first side and a second side opposite the first side, the heat spreader including at least one oscillating heat pipe arranged between the first side and the second side, at least one of the at least one oscillating heat pipe including a plurality of interconnected channels including a working fluid; at least one optoelectronic component coupled to the first side of the heat spreader; and at least one thermoelectric cooler, wherein a cold side of the at least one thermoelectric cooler is coupled to the second side of the heat spreader. The heat spreader may include one or more heat exchange features.

16 Claims, 14 Drawing Sheets

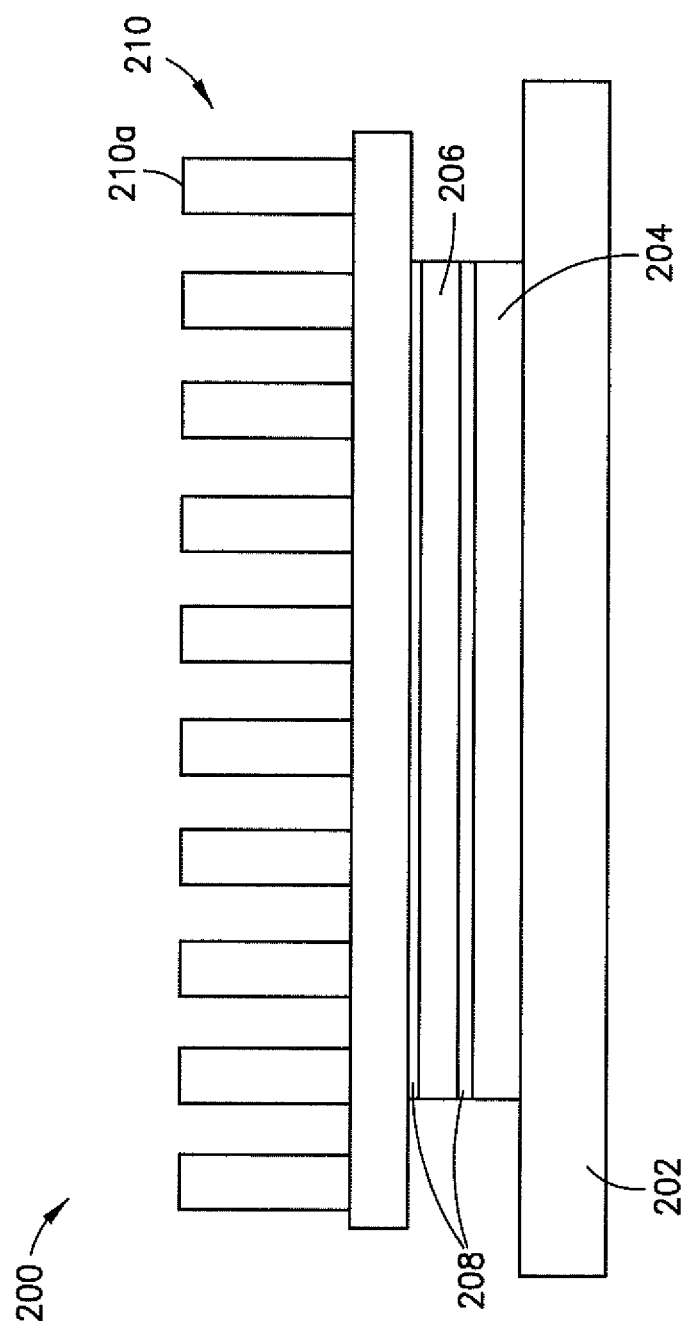

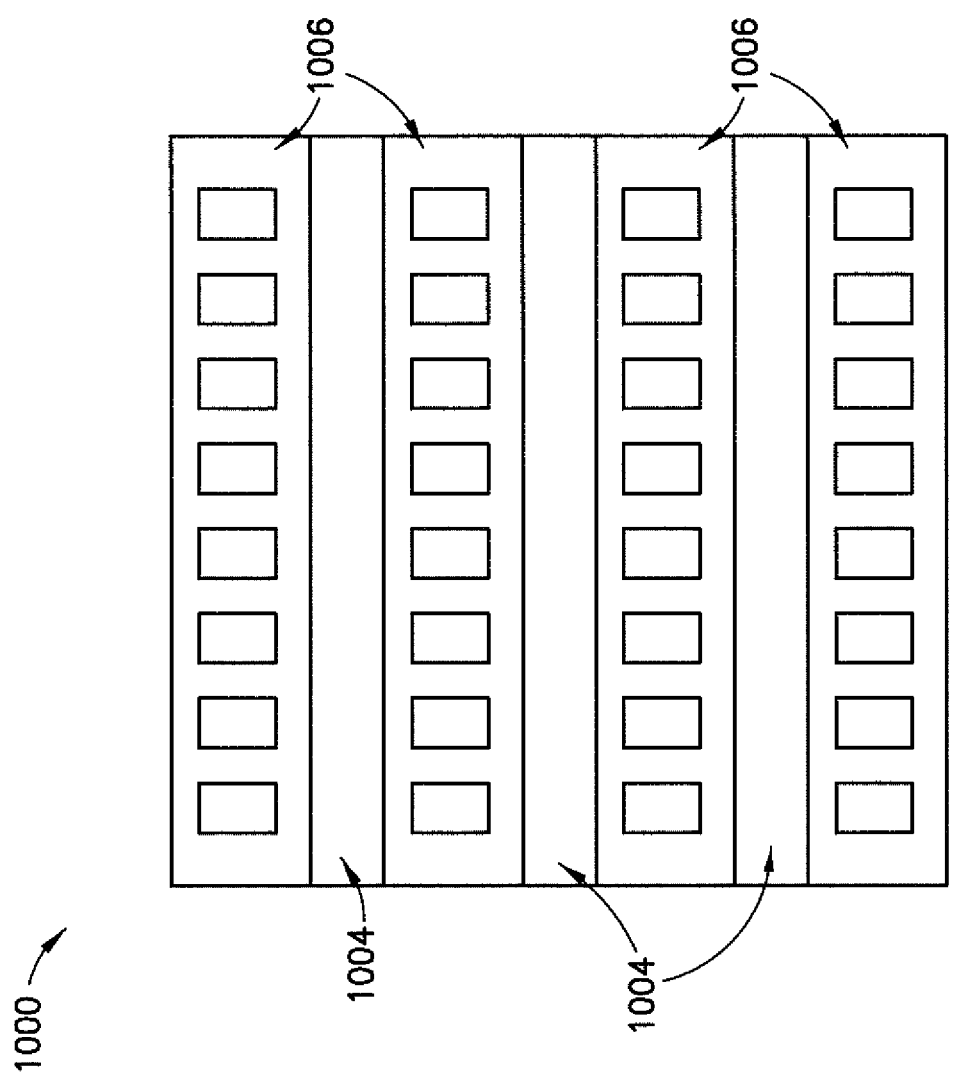

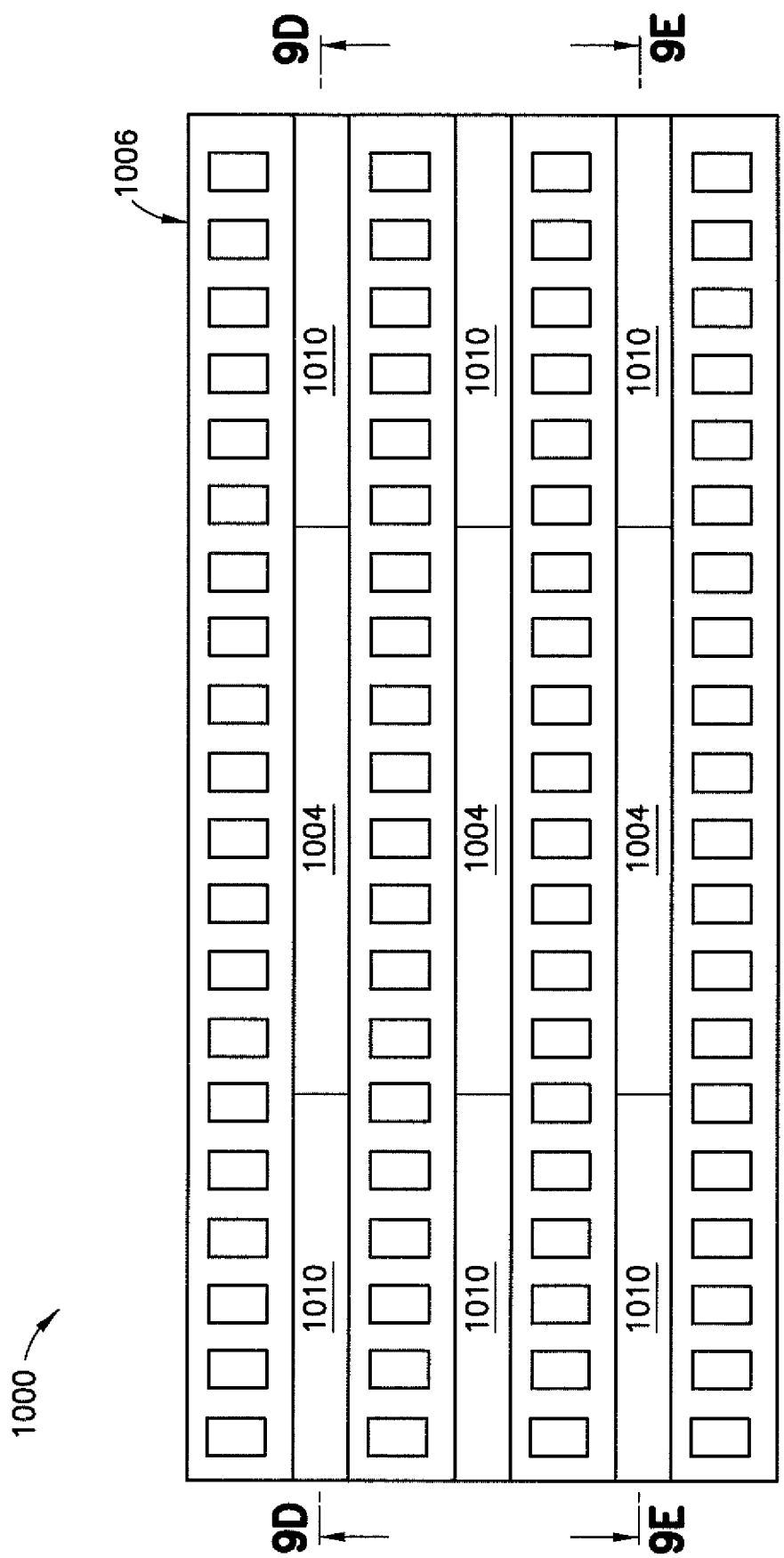

INTEGRATED HEAT SPREADER

FIELD

Example embodiments relate to a device including an integrated heat spreader, in particular a heat spreader comprising at least one oscillating heat pipe, for thermal management of electronic and optoelectronic devices.

BACKGROUND

Increased device integration is required for continued growth of computing power and network capacity. Devices are thus becoming challenged by die-level and package-level thermal constraints. In some radio frequency integrated circuit (RFIC) devices, more than 70% of the transistor junction-to-ambient thermal resistance is within the package. This behaviour extends to other devices, including FPGAs, ASICs, DSPs, system on chips (SoCs), other RF electronics and optoelectronic devices such as lasers, semiconductor optical amplifiers (SOAs), modulators, photonic logic circuits (PLCs), photonic integrated circuits (PICs) and laser arrays.

It is therefore desirable to provide thermal management solutions directly to the chip/module/SoC inside of the packaged device to provide efficient heat spreading and/or heat transport within the package and/or to the boundary/exterior of the package.

SUMMARY

The scope of protection sought for various embodiments of the invention is set out by the independent claims. The embodiments and features, if any, described in this specification that do not fall under the scope of the independent claims are to be interpreted as examples useful for understanding various embodiments of the invention.

According to a first aspect, this specification describes a device comprising: a heat spreader having a first side and a second side opposite the first side, the heat spreader comprising at least one oscillating heat pipe arranged between the first side and the second side, at least one (i.e. one or more, optionally each) of the at least one oscillating heat pipe comprising a plurality of interconnected channels comprising a working fluid; at least one optoelectronic component coupled to the first side of the heat spreader; and at least one thermoelectric cooler, wherein a cold side of the at least one thermoelectric cooler is coupled to the second side of the heat spreader.

The heat spreader of the device of the first aspect may optionally comprise one or more heat exchange features. The use of such features can combine functionalities of oscillating heat pipes with functionalities of wick-based (or wick-incorporating) heat pipes to improve heat transfer.

According to a second aspect, this specification describes a device comprising: a heat spreader having a first side and a second side opposite the first side, the heat spreader comprising at least one oscillating heat pipe, each oscillating heat pipe comprising a plurality of interconnected channels comprising a working fluid, the heat spreader further comprising one or more heat exchange features; at least one electronic component coupled to the first side of the heat spreader; and a heat exchanger coupled to the second side of the heat spreader.

In some examples, the heat exchanger of the device of the second aspect may comprise an active heat sink, optionally a thermoelectric cooler. In some examples, the heat exchanger may be a passive heat exchanger, optionally a heat sink. The electronic device may optionally be an optoelectronic device.

It will be understood that the channel walls (i.e. the walls within the oscillating heat pipe that define the channels and contain the working fluid) act as heat transfer fins. Heat received at the first and second sides of the heat spreader conducts (via solid state conduction) into the channel walls and then into the working fluid. If the channels of the heat spreader have a high aspect ratio, such that the area of the wall is greater than the base of the channel, a higher proportion of heat is conducted into the working fluid than from the first and second sides. As such, the channel walls can be a main point of conduction of heat into and out of the working fluid.

In examples of both the first and second aspects, one or more layers may be disposed between the heat spreader and the (opto)electronic component. For example, the opto(electronic) component may be disposed on a silicon substrate, or other suitable substrate, and the substrate may be coupled to the first side of the heat spreader.

Other embodiments of the devices of the first and second aspects are discussed below.

In some examples, one or more (optionally each) of the at least one oscillating heat pipe may comprise one or more structures provided within the plurality of interconnected channels, wherein the one or more heat exchange features comprise the one or more structures.

The one or more structures may comprise one or more protrusions extending into one or more of the plurality of channels in a direction from the first side to the second side. These protrusions can help to draw liquid into a portion of the channel nearest the component to be cooled and can cause a thin liquid film to persist at the bottom of the channel. Placing these protrusions, and thus a thin liquid film, proximate the component to be cooled can enhance evaporative heat transfer.

The protrusions may comprise one or more series of tall and/or short pillars. A series of tall pillars can comprise a first plurality of pillars with a height greater than a first threshold height. A series of short pillars can comprise a second plurality of pillars with a height less than a second threshold height. Optionally, the first threshold height is greater than the second threshold height. For example, a tall pillar may be more than 50% of a height of the channel, optionally more than 60% of the channel height (i.e. 50% or 60% of the channel height is the first threshold height). A short pillar may be less than 40% of a height of the channel, optionally less than 30% of the channel height (i.e. 40% or 30% of the channel height is the second threshold height). Optionally, a short pillar may be less than 10% of the channel height, optionally less than 1% of the channel height. For example, some of the short pillars may be between 1 and 10 microns tall, and the channel height may be between 200-300 microns. In other examples, the pillars may be between 10 and 50 microns tall.

The tall pillars can act as a wick, whilst the short pillars not only act as a wick but help to draw liquid to the edges of the channels. Appropriate placement of the short pillars around the component to be cooled can aid evaporation of the liquid phase of the working fluid. The size and shape of the pillars (and thus the aspect ratio) may vary depending on the desired application. For example, the pillars may have an aspect ratio of between 1:1 and 1:100, optionally between 1:1 and 1:10. The pillars may also be arranged or configured to increase wettability or to make a hydrophobic surface, as desired for the particular application.

The one or more structures may comprise one or more splitters configured to split one or more of the plurality of channels. The use of splitters can increase the number of channels and thereby increase the channel wall area, which increases the area available for heat transfer to the fluid. In general, more area available for heat transfer to the fluid will increase the heat transfer effectiveness. Additionally, by decreasing the channel width (in order to fit in more channels) the conduction length into the fluid becomes smaller, which increases the heat transfer.

The one or more structures may comprise at least one of a contraction or an expansion of a diameter of one or more of the plurality of channels. Such contraction/expansion can form a passive valve which improves heat transfer. Moreover, these structures can be more reliable than an active valve since there are no moving parts and no power is required. Combining a valve with one or more protrusions can help to split the fluid flow in different parts of the channel into the respective liquid and vapour phases to improve heat transfer.

Optionally, the heat spreader comprise a heated region proximate the component to be cooled (e.g. the electronic or optoelectronic component), a cooled region proximate the thermoelectric cooler (or other heat exchanger) and an adiabatic region between the heated and cooled regions. Optionally, the one or more structures are provided in the heated region of the heat spreader.

In some examples, the device further comprises a heat sink coupled to a hot side of the thermoelectric cooler. Optionally the heat sink comprises a finned heat sink. The finned heat sink may be passively cooled (e.g. via natural convection) or may be actively cooled (for example via one or more fans or any other suitable method).

Optionally the optoelectronic device comprises at least one of: a laser, a semiconductor optical amplifier (SOAs), a modulator, a laser array, an AWG (arrayed waveguide device), a PLC (photonic logic circuit), a PIC (photonic integrated circuit), or a wavelength tuning element (such as a ring resonator). Optionally, the laser array is a laser diode array.

In some examples, the heat spreader comprises two (or more) oscillating heat pipes arranged adjacent to one another. The oscillating heat pipes may be independent of one another, to allow isolation of the components on each heat pipe circuit. In this way, it is possible to improve tailoring of the integrated heat spreader to the device. For example, certain components can be thermally isolated from the rest of the chip or package Alternatively, the heat spreader with two (or more) oscillating heat pipes may further comprise one or more heat exchange features, wherein the one or more heat exchange features comprise a thermoelectric couple (or more than one thermoelectric couple or thermocouple) configured to exchange heat between the two adjacent oscillating heat pipes to drive the working fluid around the respective oscillating heat pipes. Moreover, in some examples the device may further comprise means for monitoring a temperature of one or more components of the device, where the thermoelectric couple is controlled based on the temperature. Providing a thermocouple between the oscillating heat pipes facilitates the driving of heat flow by providing a local heat source/sink (i.e. one of the oscillating heat pipes can act as a heat source/heat sink, though in some examples a separate heat source/sink may be provided). The thermocouple also allows to re-use the heat (or cooling) that gets generated by the thermocouple, which thermocouple might simply reject (or absorb) the heat from the ambient environment. The placement of the thermocouple between two OHP circuits improves energy efficiency, as one of the OHP circuits can re-use the waste heat (or cooling) from the thermocouple.

In some examples, the heat spreader comprises a first plate and second plate, the at least one oscillating heat pipe formed between the first and second plates. For example, the heat spreader is a flat, or plate, heat spreader. The heat spreader can be formed of two plates (or panels) coupled together, the interconnected channels of the oscillating heat pipe etched or others formed on surfaces of the first and/or second panels or plates.

In some examples, the one or more heat exchange features comprise one of the first and second plates being formed of a thermally conductive material and the other of the first and second plates being formed of a thermally insulating material. This arrangement can allow to isolate one or more components. In some examples, both the first and second plates may be made of thermally insulating materials. When both plates are thermally insulating, one or more thermal vias (formed of copper, silver, or any other suitable thermally conductive material) may be added in areas of the heat spreader where heat is intended to be rejected or absorbed. In this way, heat may be transferred from the component to be cooled and into the working fluid via the thermal vias.

Optionally, the thermally conductive material comprises one or more of: silicon, silicon carbide, aluminium nitride, diamond impregnated materials, beryllium oxide, aluminum oxide. Optionally, the thermally insulating material comprises a glass (examples include silica, borosilicate glass, etc), and one or more thermally conducting vias are arranged through the glass. Other thermally insulating materials comprise plastics, or composite materials such as FR4 (glass-reinforced epoxy laminate). For porous materials, the interior of the heat spreader channels may be coated with a non-porous material such as a metal, in order that the heat spreader may be hermetically sealed. In some examples, the heat spreader may be formed within or otherwise incorporated into other insulating materials, such as a printed circuit board.

According to a third aspect there is provided a method of cooling a device of the first aspect. The method comprises: operating the optoelectronic component, wherein heat generated by operation of the optoelectronic component causes a portion of the working fluid disposed within the interconnected channels and proximate the optoelectronic component to absorb heat (i.e. to evaporate if the liquid phase, or expand in volume if the vapour phase); and operating the thermoelectric cooler to draw heat from the cold side to a hot side of the thermoelectric cooler, thereby to cause a portion of the working fluid disposed within the interconnected channels and proximate the cold side of the thermoelectric cooler to reject heat (i.e. to condense if saturated vapour, or to contract in volume if a superheated vapour). The absorption and rejection of heat by the working fluid (i.e. the evaporation/volume expansion and condensation/volume contraction of the working fluid) causes circulation of the working fluid within the oscillating heat pipe to transfer heat from the optoelectronic component to the thermoelectric cooler to cool the device.

Optionally, the method further comprises providing one or more structures within the plurality of channels, wherein during the circulation of the working fluid the working fluid circulates around the one or more structures. For example, the working fluid may circulate past or through the one or more structures.

Example embodiments of the first aspect may also provide any feature of the method.

According to a fourth aspect there is provided a device comprising a three-dimensional integrated circuit, the three-dimensional circuit comprising: one or more chip layers, each chip layer comprising at least one chip and at least one heat sink at least partially arranged around the at least one chip; and one or more heat spreaders, each heat spreader comprising at least one oscillating heat pipe, each oscillating heat pipe comprising a plurality of interconnected channels containing a working fluid, wherein the one or more chip layers are alternately arranged with the one or more heat spreaders in a stack, each heat spreader in thermal communication with the at least one heat sink and the at least one chip of each adjacent chip layer.

In some examples, each heat sink comprises a plurality of microchannels, the plurality of microchannels disposed in the chip layer and arranged to circulate a cooling fluid around the at least one chip. In some examples, the device further comprises a pump configured to pump the cooling fluid through the plurality of microchannels.

Optionally, the one or more chip layers comprise a plurality of chip layers and the one or more heat spreaders comprise a plurality of heat spreaders. By locating the heat sink around the chip in one layer, the heat sink in thermal communication with the adjacent layers of heat spreaders, this arrangement can provide effective integrated cooling of a three-dimensional integrated circuit.

Example embodiments of the first and second aspects may also provide any feature of the fourth aspect.

BRIEF DESCRIPTION OF DRAWINGS

Example embodiments will now be described, by way of non-limiting example, with reference to the accompanying drawings, in which:

FIGS. 2A, 2B, and 2C are schematic views of a device including a heat spreader for use in cooling the device, the heat spreader comprising an oscillating heat pipe;

FIG. 9A is a schematic view of a three-dimensional integrated circuit device;

FIGS. 9B, 9C, 9D, and 9E are schematic views of an example arrangement for improving the component cooling such a three-dimensional integrated circuit device;

DETAILED DESCRIPTION

Example embodiments relate to devices and methods for cooling a component of a device.

Figure 1A:
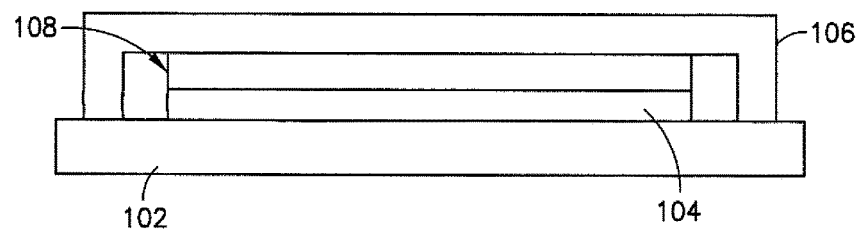
FIGS. 1A and 1B are schematic views illustrative of known approaches to cooling a device using a heat spreader.
Figure 1B:
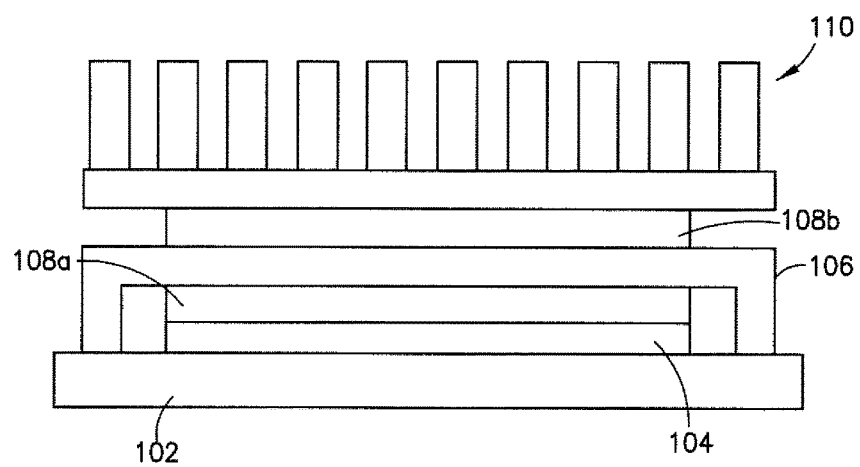

With reference to FIGS. 1A and 1B, some known approaches to cooling components of a device are discussed. In these examples, the component is a CPU chip 104 mounted on a package substrate or PCB 102, but any other suitable electronic or optoelectronic component may be cooled in a similar way.

These known approaches use solid-state materials to spread and/or transport heat from a package device. The heat is typically spread using solid state conduction. For example, Intel and AMD utilize a metal integrated heat spreader (IRS) 106 that is attached to the CPU chip 104 using either a thermal interface material (TIM) layer 108a or solder. The IHS 106 can be glued to the package substrate or PCB 102. Chips or dies arranged in this way are referred to as "lidded" (as compared to "lidless" or "bare die" approaches, where the die or chip is in direct contact with the heat sink). In some known, high performance, devices, a liquid metal TIM may be used.

An air-cooled or liquid-cooled heat sink 110 is then typically attached on top of the lidded CPU using an additional thermal interface material 108b (see FIG. 1B, which shows a finned heat sink 110).

The nomenclature TIM1 and TIM2 is often used to refer to the thermal interface materials interior 108a to the lidded die and exterior 108b to the lidded die, respectively. From a thermal management perspective it can be preferable to use a solder, which tends to have a significantly higher thermal conductivity than, for example, a ceramic-loaded polymeric TIM. However, the solder may be much less compliant than the ceramic-loaded polymeric TIM and could have reliability issues such as cracking or debonding during repeated thermal cycling throughout the lifetime of the CPU.

In the arrangements shown in FIGS. 1A and 1B, a key factor controlling heat transport from the CPU chip 104 or silicon die is the available area for heat transfer to an attached heat sink and the associated thermal resistance. Typically, the IHS 106 has a very thin form factor, and is thus limited in its ability to spread heat away from hot spots on the CPU chip 104 or silicon die, as well as in its ability to spread heat beyond the form factor of the chip/silicon die. As such, there can be highly localized heat fluxes which are difficult to cool effectively. However, tolerance and assembly issues can make it challenging to implement "bare die" approaches, which often require the use of a thicker TIM material to allow for greater tolerance mismatch, as well as the machining of offsets into the heat sink base to accommodate discrete devices that are often placed around the silicon die.

The CPU example of FIGS. 1A and 1B is just one example of a high heat flux application. Similar thermal challenges exist for FPGAs, ASICs, SoCs, opto-electronic devices such as lasers with integrated electronics, RFICs, etc. The ability to efficiently transport heat away from these devices is paramount to maintaining desired levels of device performance and to ensure device reliability. It is therefore desirable to improve heat transfer from electronic and optoelectronic devices, particularly in a high heat flux application.

Figure 2B:
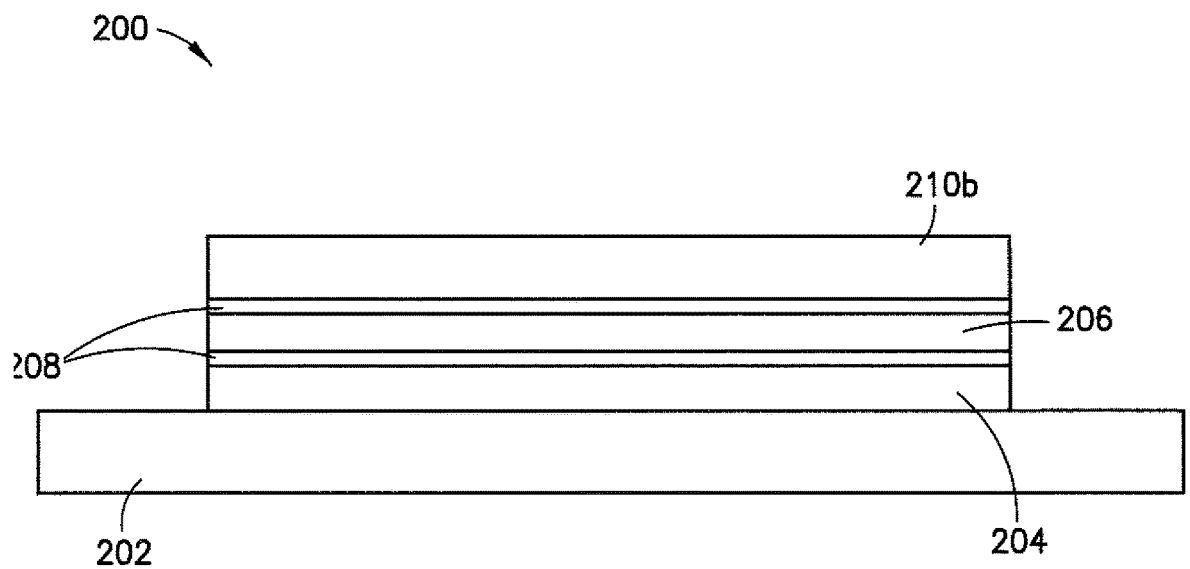
Figure 2C:
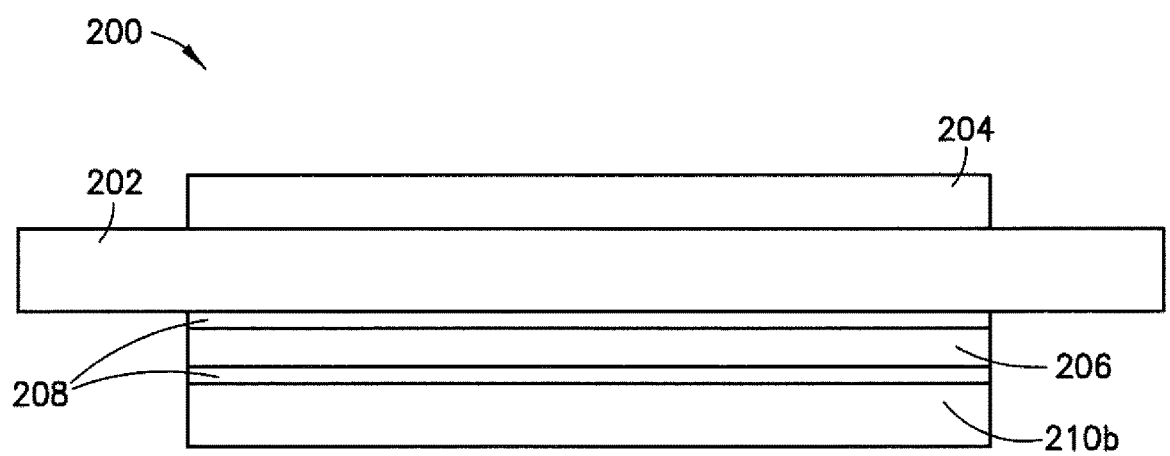

With reference to FIGS. 2A, 2B and 2C, a device 200 is described which addresses at least some of the heat transport issues discussed above. A substrate 202 is shown, on which an electronic component 204 may be mounted. In the examples described herein, the electronic component is an optoelectronic component, but it will be understood that the concepts discussed below can be implemented with any other components, as required. A heat spreader (HS) 206 is provided, having a first side and a second side opposite the first side. The optoelectronic component 202 is coupled to the first side of the heat spreader with a thin layer of thermal interface material 208 or solder, or in some implementations layer 108 may be an epoxy. A heat exchanger is coupled to the second side of the integrated heat spreader 206 with a thin layer of thermal interface material 208 or solder. In FIG. 2A, the heat exchanger is a heat sink 210a, such as a finned heat sink 210. The finned heat sink 210 may be actively liquid-cooled or air-cooled, depending on the application of the device. In other examples, the heat exchanger may be a passive heat exchanger, i.e. one which is not actively cooled. In FIG. 2B, the heat exchanger is an active heat sink 210b, in particular a thermoelectric cooler. The thermoelectric cooler (TEC) has two sides, a "cold" side (or heat absorption side) and a "hot" side (or heat rejection side). In the examples described herein, the cold side of the TEC 210b is coupled to the second side of the HS 206.

In FIG. 2C, an alternative arrangement to FIG. 2B is shown, in which an optoelectronic component 204 is disposed on a substrate 202 (which may be formed of silicon, for example). The optoelectronic component 204 is coupled, via substrate 202, to the cold side of the TEC 210b. The intervening heat spreader 206 is then disposed between the TEC cold side 210b and the component/substrate (204/202). In this arrangement, the optoelectronic component is not sandwiched between the substrate 202 and the heat spreader 206, but rather sits on top of the substrate 202. This arrangement can help to minimise the heat that needs to be rejected from the component. The exact structure of the device may be determined in part by packaging consideration, and may vary depending on the type of component being used.

A thermoelectric cooler operates by the Peltier effect. When a DC electric current flows through the device, the charge carriers in the n-doped and p-doped semiconductor elements within the device transfer heat from one side to the other, so that one side can have a temperature lower than the other side. The cold side is the side which is arranged to get cooler, and the hot side is the side that has a higher temperature relative to the cold side. The hot side can be attached to a heat sink (not shown in FIG. 2B or 2C) so that it remains at or near ambient temperature, while the cold side can be driven below ambient temperature. This active cooling can be used to draw heat away from the HS 206 which is coupled to the cold side of the TEC 210b, and thus heat can be drawn away from the optoelectronic component 204.

In order to facilitate more effective heat spreading and heat transfer, the HS 206 described herein comprises at least one oscillating (or pulsating) heat pipe arranged between the first side and the second side, one or more (optionally each) of the oscillating heat pipes comprising a plurality of interconnected channels comprising a working fluid.

Heat pipes employ phase change to transfer thermal energy from one point to another by the vaporization and condensation of a working fluid. The operation of an oscillating heat pipe (OHP) is discussed further with reference to FIG. 3, which shows an OHP 300 comprising a channel 320. Although channel 320 is shown as a single, continuous channel, it is formed with multiple loops or turns which can be considered to form a plurality of interconnected channels 320. In other examples, splitters or dividers may be provided so that the plurality of interconnected channels are formed from more than one channel. In the examples described herein the channels are arranged to form a closed loop, but it will be understood that in some examples the channels may instead form an open loop.

The channels 320 contain a working fluid 330 configured to exist in both liquid and vapour phases, which is often referred to as a saturated state or saturated fluid. For example, the channels can be filled with saturated fluid until the saturated fluid completely occupies the channel volume. After filling, the channels are sealed to form a closed system. In other words, the channels 320 can be hermetically sealed. Once within the closed channels 320, the working fluid 330 will distribute itself naturally as liquid "slugs" 330a and vapour "bubbles" 330b (see FIG. 3). It will be understood that, in the arrangement described with respect to FIG. 2B and FIG. 2C, a side edge of the heat spreader 206 (i.e. an edge extending between the first and second sides) is a preferred fill location, as this leaves the top and bottom surfaces (or first and second sides) of the heat spreader free of any fluidic connections.

In some examples, an access channel can be etched into the heat spreader that allows the placement of a fill tube into the heat spreader. The access channel may then be metallized, for example, with titanium/platinum/gold (Ti/Pt/Au) or other suitable metallization, either before or after the heat spreader is assembled (discussed below in more detail with reference to FIG. 4). The fill tube can, in some examples, be secured within the access channel using either solder or a vacuum-rated adhesive such as an epoxy. In some examples, the fill tube can comprise a fine gauge (25 gauge or 30 gauge) stainless steel hypodermic needle, which needles can be plated with a thin layer of nickel (Ni) followed by gold (Au) to allow them to be soldered to the access channel. The fine gauge fill tube is then soldered into the heat spreader and attached to a larger diameter tube that connects to an apparatus for removing the air from the OHP channels and subsequently fills the OHP with the preferred working fluid(s).

The benefit of placing the fill tube on the side if the heat spreader is that this location allows the top and bottom surfaces of the device to be fully populated with electrical or optical device, electrical traces for providing signal and power, and heat sinking structures. This approach also allows ready attachment to other substrates, as might be the case in a multi-chip module or when using the heat spreader as an interposer.

In operation, the OHP 300 is arranged such that one portion is configured to receive heat, here termed a heat input or heated region 340a. Sensible heat is the heat that causes an object to change temperature. When an object is heated/cooled the increase/decrease in heat is called the "sensible heat". "Latent heat" is the heat the heat added to an object in order for it to change state. The liquid phase 330a within the heated region 340a, in which heat 350a enters the OHP, can therefore absorb heat and increase the liquid temperature (sensible heat) or liquid can be evaporated by the (latent) heat entering the OHP.

Fluid motion within the evaporator is facilitated by vapour generation (due to evaporation) or vapour expansion (due to sensible heat rise) from absorbing the heat entering 350a the OHP. The heat input or heated region 340a may therefore also be known as the evaporator region, vapour expansion region, or heat absorption region. Another portion of the OHP is arranged to be in contact with a cooled region 340b configured to transfer heat out 350b of the OHP. Heat rejection in the cooling region can occur by a decrease in the liquid or vapour temperature (sensible heat) or condensation of the vapour phase (latent heat). Fluid motion within the cooled region 340b can occur by vapour contraction (due to sensible heat decrease) and vapour removal (due to condensation), which are caused by heat being transferred out of the OHP at the cooled region. The cooled region 340b may therefore also be known as the condenser, or vapour contraction, or heat sink region. An adiabatic zone or region may exist between the two regions in which no heat is transferred in/out of the OHP 300.

The working fluid 330 circulates around the channels 320 of the OHP 300 in response to the pressure fluctuations caused by the temperature gradient between the heated and cooled regions 340a, 340b. In particular, the temperature differences across the OHP can cause a non-equilibrium pressure condition inside the channels 320 which forces the working fluid around the system. Other contributions to the non-equilibrium pressure condition come from nucleation and growth of the vapour bubbles 330b upon evaporation of the working fluid from the liquid phase 330a (and the rejection of heat at the cooled region also results in fluid motion by the coalescence and shrinkage of vapour bubbles 330b). Heat is transferred (spread) by the net convective motion of the working fluid 330 within the channels 320 and includes both sensible heat and latent heat contributions.

With reference to FIG. 4, the heat spreader 206 can preferably be fabricated utilizing materials that are inherently compatible with existing semiconductor technology, namely silicon and/or glass. The heat spreader 206 described herein consists of a top plate 412 and a bottom plate 414, which plates can be made of silicon or glass, amongst other materials. At least one of the top plate and bottom plates has channel structures etched into the plate to form the plurality of interconnecting channels 320.

Channel structures can be etched into the silicon and/or glass materials using standard silicon deep reactive ion etching (DRIE) or chemical etching processes, for example. The size of the etched channels (for example, channels can be between 100 and goo microns in width and/or height, optionally between 200 to 700 microns in width and/or height) is achievable using existing silicon and glass processing technologies. Any suitable dry or wet etch process for silicon and glass may be used.

By utilizing silicon to form the plates of the heat spreader, the coefficient of thermal expansion is exactly matched to that of the silicon chip of the optoelectronic component 204, thereby removing issues related to thermal stress development at the interface between the silicon die and attached two-phase integrated heat spreader 206. Glass can be preferred for some optical and optoelectronic applications, since it is thermally insulating and can help to isolate high heat flux components and/or temperature-sensitive components from the rest of the device.

For the case of glass, the thermal expansion coefficient (CTE) of borosilicate glass, a common glass wafer material, is on the order of $3.3 \times 10^{-6}$ C$^{-1}$, while that of single crystal silicon is of the order $3.9 \times 10^{-6}$ C$^{-1}$, a relative difference of 15%. This is in contrast to aluminium and copper used to form known IHS 106, which have CTE values of approximately $24 \times 10^{-6}$ C$^{-1}$ and $17 \times 10^{-6}$ C$^{-1}$, respectively (corresponding to relative differences of 515% and 336% with the CTE of silicon, respectively).

The exact and near exact matching of CIE values, respectively, for silicon and glass means that the thickness of TIM1, layer 108a, can be minimized as compared to the known approaches of FIGS. 1A and 1B, and/or high-performance solder materials used with significantly less concern for solder delamination and voiding. The use of glass as a potential plate material also provides capabilities to thermally isolate temperature-sensitive components (such as lasers and semiconductor optical amplifiers) from other electronics whose performance is not as severely impacted by temperature (such as trans-impedance amplifiers (TIAs) and drivers). When glass is used to form at least part of the heat spreader 206, copper-filled thermal vias (not shown) can be implanted within the glass to facilitate heat transfer from the component(s) to be cooled into the fluid, and from the fluid to an attached heat exchanger, such as the TEC 210b or a another form of heat sink.

In particular, glass has a more thermally insulating behaviour than silicon, with typical thermal conductivities being on the order of 1 W/mK which is approximately two orders of magnitude lower than that of single crystal silicon. Therefore, when a glass substrate is used for either the bottom or top plate of the heat spreader, or both, it is necessary to augment the glass substrate with additional conductive material. For example, copper-filled thru glass vias (TGVs) can be used that facilitate heat transfer through the glass plate both from a heat source such as component 204 and into the working fluid 330, and from the fluid 330 and into a heat exchanger such as heat sink 210a or thermoelectric cooler 210b. Other materials such as silver and gold can also be used as via fill material, and/or nanoparticles made of highly conductive materials, like diamond, can be added to the via fill material. TGVs can be placed preferentially in the heated (or evaporator) regions and the cooled (or condenser) regions, with an adiabatic (no heat flow) region in between with no TGVs.

Figure 4A:
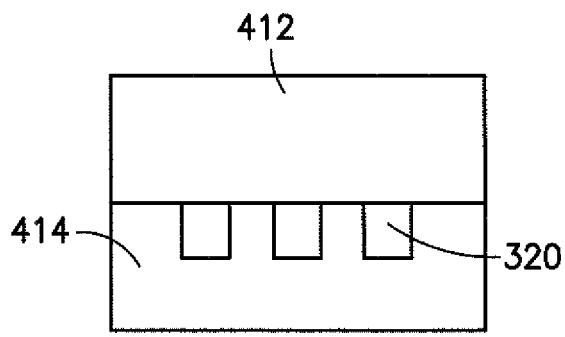
FIG. 4A to FIG. 4F is a series of cross-sectional views of example heat spreaders for use with the devices of FIGS. 2A, 2B and 2C.
Figure 4B:
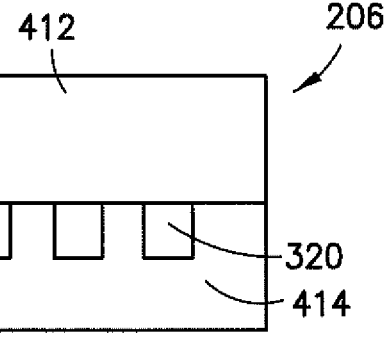
Figure 4C:
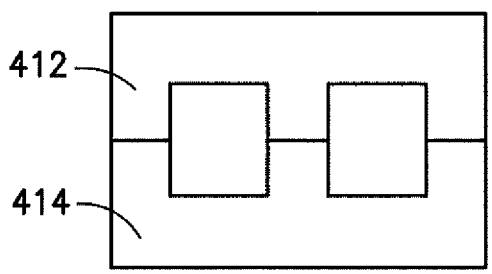
Figure 4D:
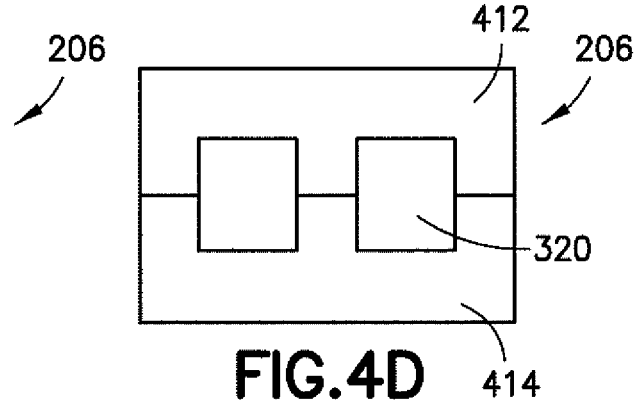
Figure 4E:
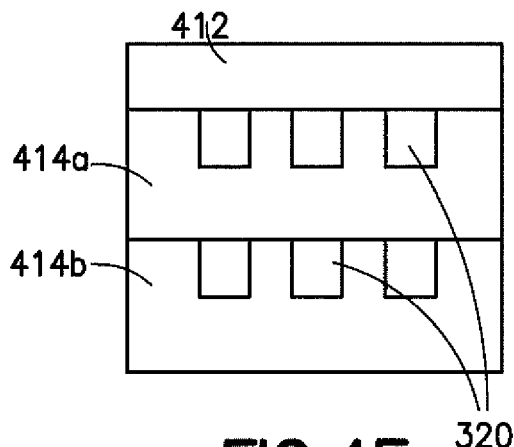

Examples of the structure of the heat spreader 206 are discussed with reference to FIGS. 4A through 4F. In FIG. 4A, a top plate 412 is formed of glass, with etched channels 320 in a bottom plate 414 formed of silicon. In FIG. 4B, a top plate 412 is formed of silicon, with etched channels 320 in a bottom plate 414 formed of silicon. In FIG. 4C, a top plate 412 is formed of glass and a bottom plate 414 is formed of silicon; channels have been etched in both the top and bottom plates. In FIG. 4D, a top plate 412 is formed of silicon and a bottom plate 414 is formed of silicon; channels have been etched in both the top and bottom plates. Another example could be to have both top and bottom plates formed of glass. The etching of channels in only one of the plates simplifies the manufacturing process, though this can limit the overall channel depth for a given heat spreader thickness as compared to etching both plates.

The use of different materials for top 412 and bottom 414 plates of the heat spreader 206 can provide the ability to selectively target and tune the thermal management of a device by utilizing a combination of thermally-conductive (e.g. silicon) materials and thermally-insulating (e.g. glass) materials. This can be advantageous as it can assist to readily manage heat from components with different temperature operating conditions. Moreover, the use of silicon and glass as substrate materials allows the ready incorporation of electrical power and signalling structures, such as metal traces on the surface of the substrate and thru-silicon vias and thru-glass vias for receiving signals and power from structures such as ball grid arrays (BGAs). However, it will be understood that although the use of silicon and glass are described herein, this choice of material is not limiting; any suitable thermally-conductive and/or thermally-insulating materials may be used to form the heat spreader 206. For example, electrical power and signalling structures may also be incorporated into other materials such as aluminium nitride.

The channel structures formed by the etching of channels 320 allow containment of the working fluid which provides the liquid/vapour phase change process (not shown). The channels 320 of the OHP can provide a self-connected meandering loop (or one or more independent loops) that traverses the heat spreader 206. For example, with reference to FIG. 4E, the heat spreader 206 may comprise two bottom panels or plates 414a, 414b and a top plate 412, all formed of silicon. Channels 320 are etched into the two bottom plates 414a, 414b to form an oscillating heat pipe of two stacked layers (a multi-layer OHP). Stacking the channels in the manner shown in FIG. 4E allows to double the number of channels 320 for a given footprint of heat spreader, and hence may be advantageous from a heat transfer perspective by providing additional channels to remove and transport heat away from a component (heat source).

The channels 320 can be structured to form one self-connected loop traversing both layers, or two independent loops may be provided, one in each layer. The ability to create multiple, independent fluidic circuits within a heat spreader 206 can facilitate targeted heat removal from separate components of device 200. This can be advantageous as it can assist to readily manage heat from components with different temperature operating conditions.

Although movement of the working fluid is primarily driven by pressure fluctuations, as discussed above with respect to FIG. 3, the oscillating heat pipe of the heat spreader 206 described herein can also incorporate one or more principles associated with conventional wick-based or wick-incorporating heat pipes (where fluid motion is enabled by liquid/vapour surface tension, e.g. by capillary action). In particular, as discussed with reference to FIG. 4F, additional heat exchange features 416 may be formed within the channels, such as smaller scale pillars and ridges etched into the bottom of the channels.

The top 412 and bottom 414 plates of the heat spreader can be joined in any suitable manner to form the heat spreader 206. The joining can be performed using one or more of: wafer bonding, anodic bonding, solder bonding and adhesive bonding. The wafer bonding and anodic bonding processes typically yield the strongest mechanical bond, which is important if a higher-pressure working fluid is used within the channels 320 in the heat spreader. However, wafer bonding typically requires very smooth and flat bonding surfaces to be successful, and the use of more specialized equipment. Solder bonding can also be quite strong, but requires metallization of the contacting surfaces of the top and bottom plates or panels. Adhesive bonding requires the working fluid to be compatible with the adhesive if a reliable joint is to be provided.

Figure 4F:
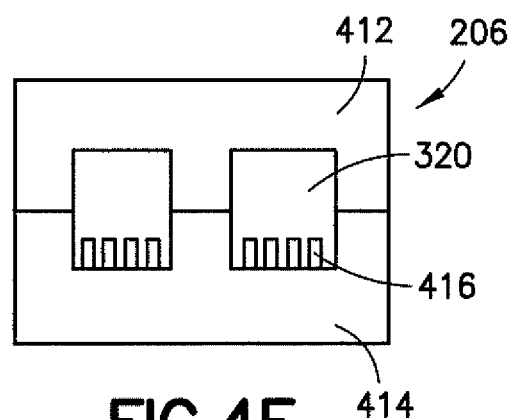

In FIG. 4F, a top plate 412 is formed of silicon and a bottom plate 414 is formed of silicon; channels have been etched in both the top and bottom plates. Moreover, further structures have been etched in the bottom plate, such that when the heat spreader 206 is assembled, the bottom of the channels 320 comprise one or more protrusions 416 extending into one or more of the plurality of interconnected channels 320 in a direction from the first side to the second side of the heat spreader. These protrusions, or heat exchange features/structures, can be dimensioned such that the flow of the liquid slugs 330a in these regions is by capillary action. Such structures can therefore aid in fluid wetting of the channel surface by providing a wicking effect, as well as providing a surface for the nucleation of vapour bubbles. Placing these heat exchange features/structures in preferred locations (for example in close proximity to an expected high heat flux region) can thus help improve heat transfer.

In other words, the use of protrusions within the channels of the OHP can be advantageous as the protrusions can: act as wicking structures that can draw fluid along the channel wall and hence provide a surface tension-based (capillary) mechanism for fluid motion within the channel; absorb liquid close to the wall of the channel and thereby ensure that a thin liquid film is available at the channel wall to absorb heat from component 204 (or other heat source); and increase the surface area available for heat transfer to the working fluid.

Other heat exchange features which may be included within the heat spreader 206, in addition to or instead of the protrusions 416, are discussed below.

In one example discussed with reference to FIG. 5, an example bottom plate or panel 414 of the heat spreader 206 is shown, etched with a plurality of channels to form interconnected channels 320 of the OHP. In this example, the plate 414 of the heat spreader can be 30 mm wide×30 mm long×0.7 mm high, formed of silicon, the interconnected channels formed to be 250 micron deep and 750 microns wide, with N=24 turns. However, any suitable geometry may be used. A series of channel splitters 622 are disposed within a portion of the etched channels, which splitters 622 are configured to narrow the diameter of the channels and introduce additional wall surface area to enhance heat transfer to the fluid. In this example, the presence of the splitters 622 narrows the channel width to 250 microns. In some examples, the splitters 622 may be tapered to smooth the transition between the wider channels and the narrower channels and aid fluid flow. These reduced channel width areas also help the formation of fluid slugs.

Figure 5:
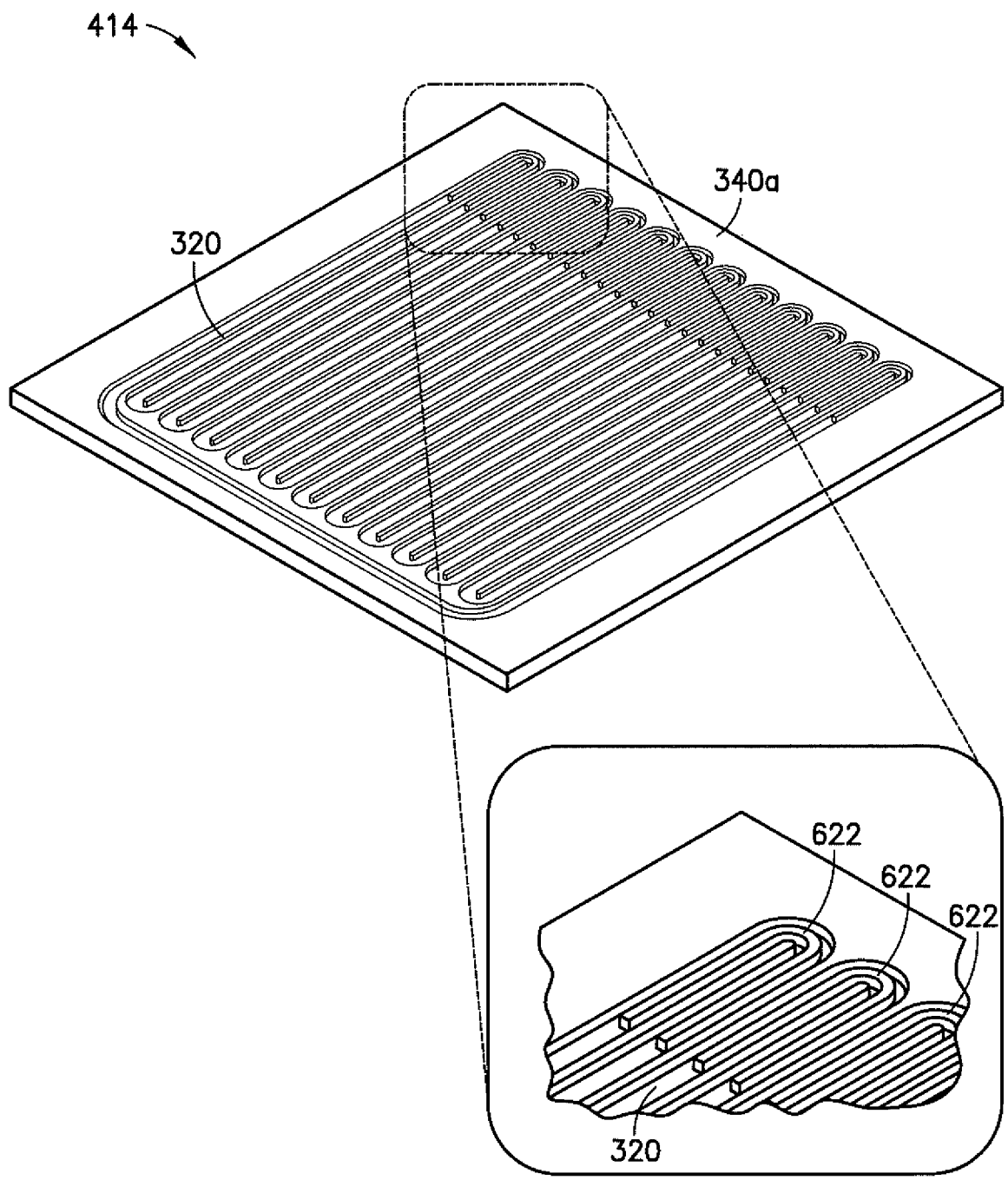
FIG. 5 provides a perspective view of an example channel splitter, the channel splitter being an example of a heat exchange feature which may be provided by the heat spreader.

In the example of FIG. 5, the channel splitters 622 are provided in the evaporator, or heated, region 340a (a portion of which is highlighted by the dashed box in FIG. 5). By providing a greater number of narrower channels in this region, the diffusion length for heat into the fluid is decreased and the wall surface area available for heat transfer to the fluid is increased, which can help increase the rate at which heat is removed from a component (such as an optoelectronic component) located proximate the evaporator region. In other examples, rather than using splitters 622, a similar effect could be obtained by narrowing the channel cross sectional area in the heated region 340a by thickening the walls between respective channels. Maintaining wider channel dimensions in the adiabatic region, where there is no heat transfer, lowers the pressure difference required to drive fluid flow between the different regions of the OHP, where the pressure difference facilitates the circulation of the working fluid around the channels and thus operation of the OHP.

It will be understood that in the evaporator and condenser regions of the OHP, there is a trade-off between pressure drop and heat transfer. On the one hand, smaller channels (and more of them) increase the heat transfer into/out of the working fluid, while on the other hand the use of larger channels lowers the pressure drop requirements for mass flow rate in the OHP.

This idea of contraction and/or expansion in the channel cross section can be additionally used within the OHP as a passive valve. Mechanical valves have been shown to improve heat transfer behaviour in OHP devices. It can be advantageous to use a passive valve (achieved with contraction/expansion of the channel dimensions) in place of an active valve since there are no moving parts; such a passive valve would therefore be more reliable and not require any power or control circuitry.

Figure 6A:
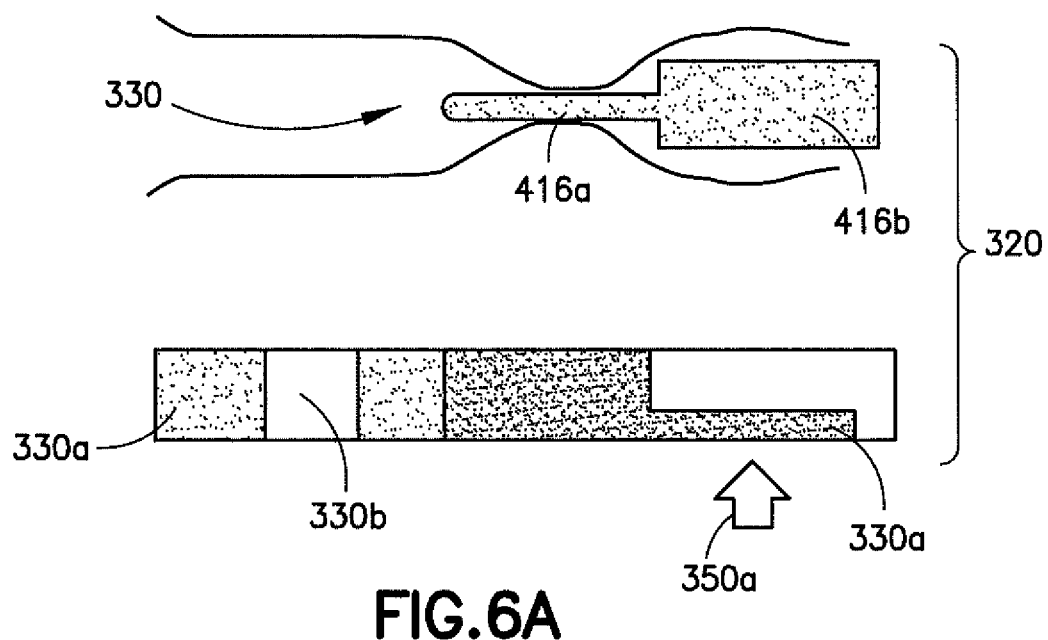
FIGS. 6A and 6B are schematic views of example uses of one or more protrusions, the one or more protrusions being an example of a heat exchange feature which may be provided by the heat spreader.
Figure 6B:
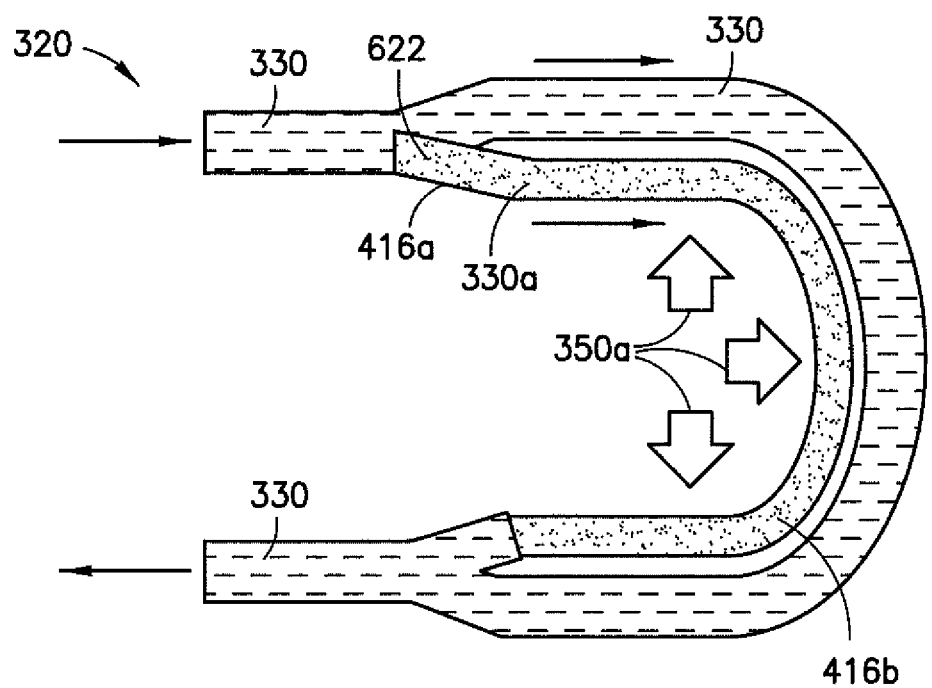

With reference to FIGS. 6A and 6B, contraction/expansions in the channel cross section and channel splitters 622 can be used in conjunction with one or more protrusions 416 to improve heat transfer and heat spreading within the OHP. For example, the protrusions 416 can be considered to act as a type of wick. If the "wick" is completely saturated with a fluid phase, say liquid or vapour, then it will have a permeability and pressure drop dictated by the fluid viscosity. However, if the protrusions (wick) have the tail end of a large slug of liquid moving through them, then there will arise a liquid/vapour interface, where the surface tension between the liquid and vapour can become the limiting factor in moving fluid through the wick. These mechanisms can mimic the actions of a valve.

As shown in FIG. 6A, a narrowing of the channel 320 cross section can be combined with a series of protrusions 416 to draw liquid preferentially into the region where heat is being dissipated. Similarly, as shown in FIG. 6B, after a splitter 622, the liquid phase 330a of the working fluid can be separated out into a separate channel using pillars or protrusions 416 which preferentially draw liquid due to their greater affinity for the liquid phase. In this instance, the pillars or protrusions are configured to be hydrophilic/omniphilic, e.g., to have a surface that the fluid prefers to wet or adhere to. Such surfaces can have an oxide layer or other coating, and are often characterized by having a low contact angle, where a liquid droplet will preferentially wet the surface to form a small (low value) contact angle when measured within the liquid phase In FIG. 6A, tall protrusions 416a are placed in the narrowing of the channel, followed by short protrusions. The tall protrusions can preferentially draw in the liquid slugs 330a, separating the liquid and vapour phases into smaller slugs/bubbles to make a more uniform working fluid (as can be seen in the side view of FIG. 6A). The short protrusions can then draw the liquid slugs 330a down to the bottom of the channel and into a thin liquid film persisting on the bottom surface of the channel, nearest the point at which heat 3505 is configured to enter the OHP. In this way, evaporative heat transfer may be enhanced. As can be seen in the side view of FIG. 6A, liquid slugs 3305 are drawn into the protrusions (wick), which slugs are shown in grey.

In FIG. 6B, the tall protrusions 416a are placed after the channel splitter 622 to preferentially draw the liquid phase into a separate channel. After wicking the liquid phase 330a along a separate channel in the heated region, short pillars or protrusions 416b can then again draw the liquid down into a thin liquid film persisting on the bottom surface of the channel, nearest the point at which heat 350a is configured to enter the OHP. In this way, evaporative heat transfer may be enhanced.

In these examples, the tall protrusions 416a extend from a first side of the heat spreader towards a second side of the heat spreader, and have a height more than 50% of a height of the channel, optionally more than 60% of the channel height, optionally more than 70%. The short protrusions 416b extend from the first side of the heat spreader towards the second side of the heat spreader, and have a height less than 40% of a height of the channel, optionally less than 30% of the channel height, optionally less than 20%. Other geometries are possible.

In some examples, the heat spreader 206 may comprise more than one oscillating heat pipe 300.

Figure 7:
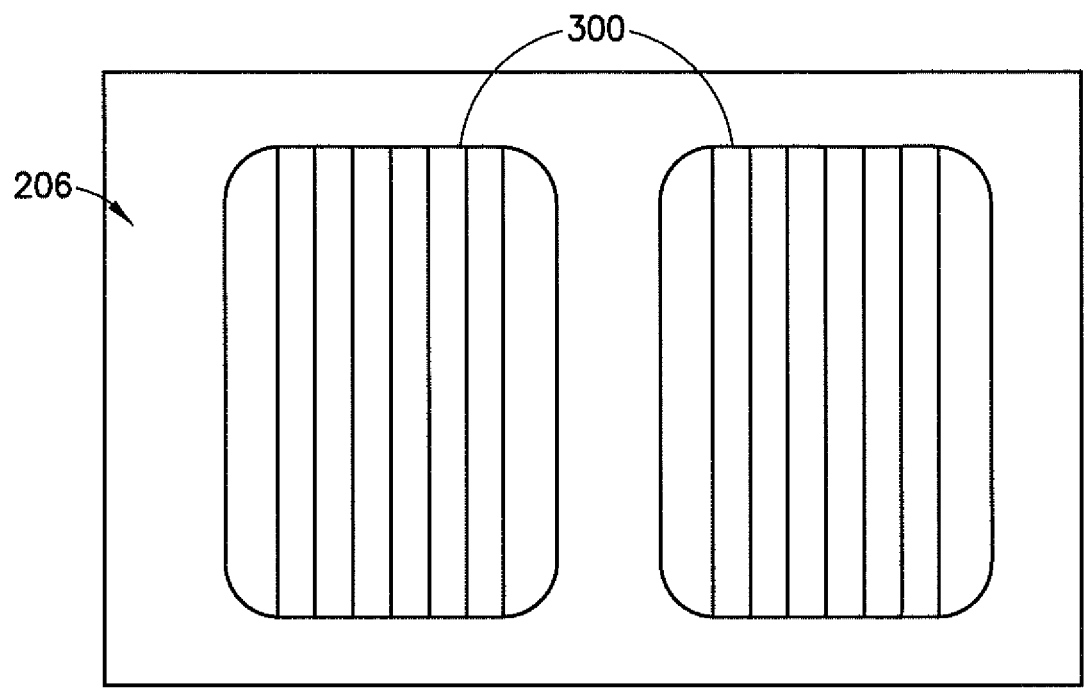
FIG. 7 is a schematic view of a heat spreader comprising two independent oscillating heat pipes.

With reference to FIG. 7, two independent oscillating heat pipes 300 are provided within the heat spreader 206. The heat pipes may have any structure as described herein. This approach of multiple independent heat pipes can allow thermal management of two components with different thermal requirements. If the plates used to form the heat spreader (HS) 206 are glass, and thermal vias are used, then the two components may effectively be thermally isolated from each other. This can be beneficial, for example, if one component is a temperature sensitive component such as a laser and the other component is a modulator, device driver or trans-impedance amplifier (TIA), which are less temperature sensitive. The thermal management can therefore be tailored to specific applications through the arrangements of the multiple OHPs 300, and additionally/alternatively through the use of thermally-insulating and thermally-conducting substrates.

Figure 8A:
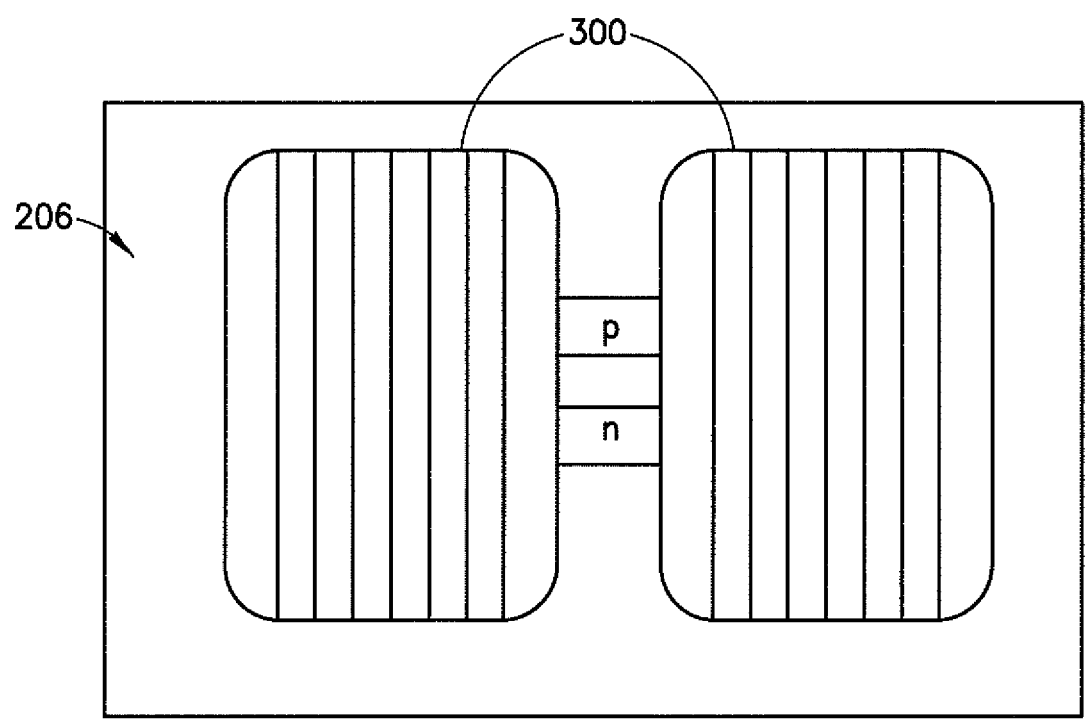
FIG. 8A is a schematic view of a heat spreader comprising two oscillating heat pipes connected by a heat pump.

With reference to FIG. 8A, two oscillating heat pipes 300 are provided within the heat spreader 206. The heat pipes may have any structure as described herein and may be thermally connected. For example, the two OHPs may be connected by one or more heat pumps, and flow of the working fluid around the respective heat pipes can be driven by pumping heat between the OHPs 300 as needed. Any suitable heat pump may be used, but in the following example the heat pump is a thermoelectric couple. A thermoelectric couple utilizes p-doped and n-doped semiconductors to transfer heat from one side of the couple to the other by flowing an electrical current in series through the couple, with the heat being transferred via the Peltier effect. FIG. 8A shows a single thermoelectric couple, but multiple thermoelectric couples may also be used and arranged in such a fashion as to advantageously pump heat between the two OHPs and facilitate fluid motion within the respective OHPs. Alternatively, the multiple OHPs may be in any other form of thermal communication, as required.

Figure 8B:
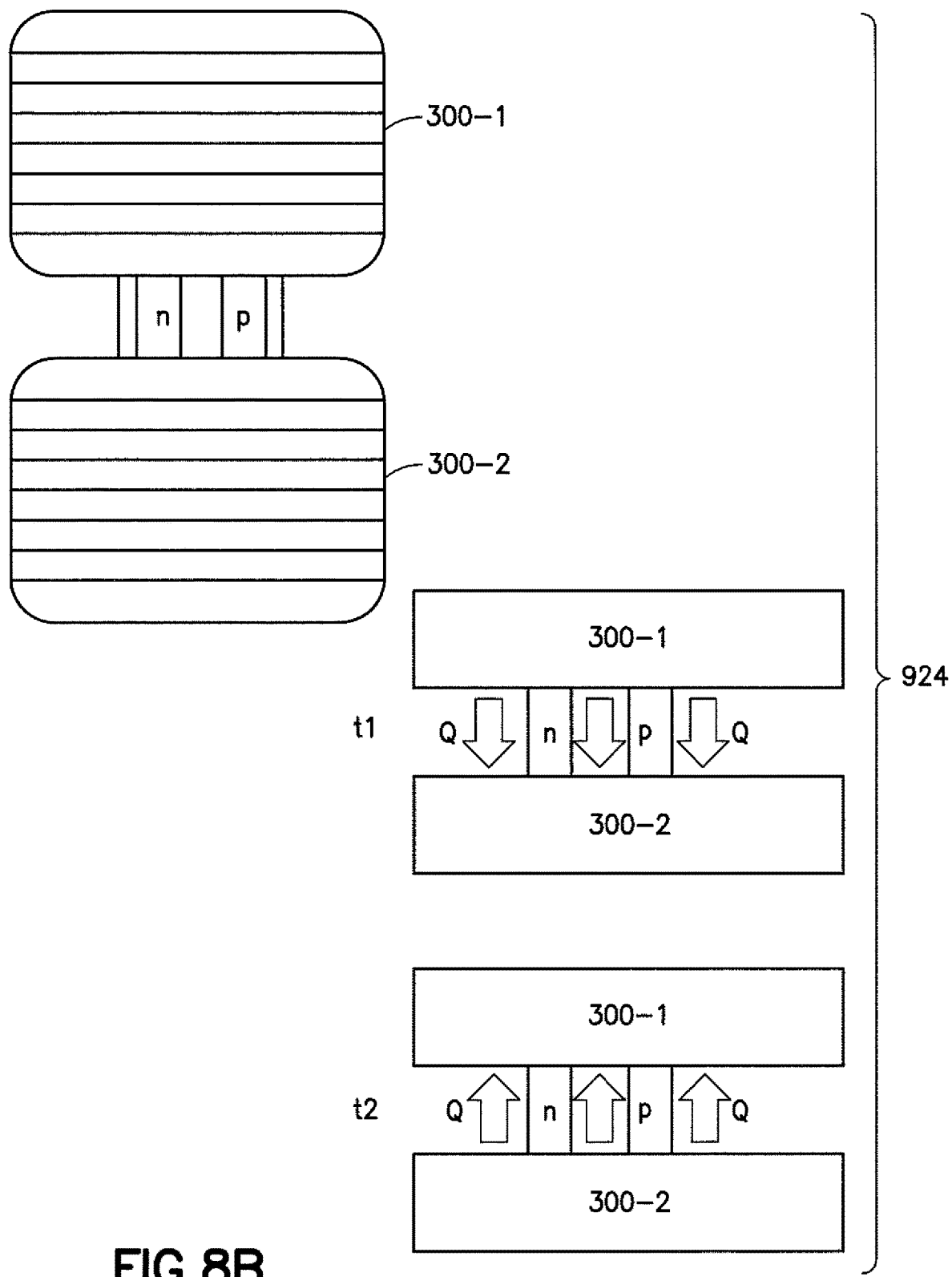
FIG. 8B is an illustrative view of operation of the heat spreader of FIG. 8A to pump heat between the two oscillating heat pipes.

In the particular example of FIG. 8B, a thermoelectric couple 924 is configured to pump heat between OHP 300-1 and OHP 300-2. For a time t1, heat (Q) is pumped by the thermoelectric coupler 924 from OHP 300-1 to OHP 300-2. For a time t2, heat (Q) is pumped by the thermoelectric coupler 924 from OHP 300-2 to OHP 300-1. Times t1 and t2 can be adjusted in a feedback loop by measuring local temperatures at the components to be cooled to optimize fluid motion and heat transfer. The mechanism for pumping heat in the thermoelectric couple is to apply an electrical current in series through the couple, which will generate a heat flow between the respective OHPs. Changing the direction of current flow (i.e. by varying the sign of the voltage across the thermoelectric couple) will reverse the direction of heat flow between the OHPs. In examples where multiple couples are used, the voltage may be alternated across all couples as a function of time with a known time period. Alternatively, some couples may be always in a +V configuration and others always in a −V configuration. By oscillating or alternating the voltage across the couple, work can be performed on the fluid to improve fluid flow within the OHPs and thus heat transfer around the heat spreader, but without adding too much additional heat into the system.

The layout and design of the interconnected channels 320 of the OHP can be determined based on the application of the heat spreader 206. However, the channels should be configured to form one or more continuous loops, which enables the working fluid 330 to circulate continuously throughout the OHP. In some examples, a plate of dimensions 30 mm×30 mm×0.7 mm may be etched with 24 parallel channels (with 24 turns), and channel dimensions of 250 microns wide and 250 microns deep. In some examples, higher density channel structure may be provided, consisting of 48 parallel channels (with 48 turns) and channel dimensions of 250 microns wide and 250 microns deep. The higher density of channels is potentially a preferred embodiment for higher heat flux applications as there is more surface area available for heat transfer to the fluid within the channels.

Table 1 below shows ranges of typical preferred geometric parameters for the channels 320 of the two-phase heat spreader 206 described herein. The selection of the channel width and depth will define the hydraulic diameter of the channel, which has significant impact on the hydrodynamic and thermal performance of the OHP and will also be impacted by the choice of working fluid within the OHP. The channel density also plays a significant factor, with greater density allowing for greater heat dissipation capability. The channel wall thickness is also important, as this impacts the thermal resistance for heat entering the heat spreader 206 and conducting up through the "fin" formed by the channel wall and into the working fluid. These dimensions are only representative values, and in some instances smaller or larger values may be desired, depending on the application.

TABLE 1

Example geometric parameters for the channels of the two-phase heat spreader.

| Parameter | Typical Range |
|---|---|
| Channel width | 200 to 700 microns |
| Channel depth | 200 to 700 microns |
| Channel wall thickness | 100 to 300 microns |
| Channel density | 1. Maximize in evaporator (heated or heat input) regions and condenser (cooled or heat sink) regions<br>2. Consider lower density and larger channels in adiabatic region - optionally a ratio of 2:1 or greater (i.e. 2 or more channels in the heated and cooled regions for every 1 in the adiabatic region) |

Fluid Selection

Potential candidate working fluids for an OHP are provided in Table 2; some of these fluids are commonly found in conventional wicked heat pipe applications, but two refrigerants, R245fa and R1234zd, are also considered. Table 2 also shows the maximum tube radius $R_{max}$ and diameter $D_{max}$ for maintaining liquid slugs with a defined wetting interface in the tube, as well as the fluid saturation pressure $P_{sat}$ at 80° C. saturation temperature.

Here the maximum tube radius is given by:

$$R_{max} = \sqrt{\frac{\sigma}{\Delta \rho g}}$$

where s and r are the fluid surface tension and density, respectively, and g is the acceleration due to gravity. This equation is derived by assuming that the ratio of surface tension to gravity forces in the fluid within the tube is of order unity.

Several interesting points are worth noting about the data in Table 2. First, all the candidate fluids have large maximum tube diameters relative to typical proposed channel dimensions. For example, the range of preferred channel widths and depths shown in Table 1 is from 0.2 mm to 0.7 mm, which is well below the smallest value of $D_{max}$ in Table 2 (which is 1.58 mm for R296fa).

Second, the working fluids have saturation pressures at 80° C. ranging from 6.88 psi for water to 146.7 psi for n-butane. This indicates that the mechanical strength of the heat spreader may be important for some of the higher-pressure working fluids. Finally, it is noted that other important physical parameter values such as liquid and vapor densities, liquid and vapor viscosities, fluid surface tension, liquid and vapor heat capacities, liquid and vapor thermal conductivities and heat of vaporization can all play an important role in the thermal and hydraulic performance of the invention (but are not considered here).

TABLE 2

Example working fluids for the two-phase liquid/vapor heat spreader and their corresponding maximum tube radius $R_{max}$ and diameter $D_{max}$ for maintaining liquid slugs with a defined wetting interface in the tube, as well as the fluid saturation pressure $P_{sat}$ at 80° C. saturation temperature.

| Fluid | water | ethanol | acetone | n-butane | n-pentane | R245fa | R1233zd |
|---|---|---|---|---|---|---|---|
| $R_{max}$ [mm] | 2.6 | 1.6 | 1.5 | 1.1 | 1.3 | 0.79 | 0.86 |
| $D_{max} = 2 \times R_{max}$ [mm] | 5.2 | 3.2 | 3.0 | 2.2 | 2.6 | 1.58 | 1.72 |
| $P_{sat}$ [psi] | 6.88 | 15.6 | 31.3 | 146.7 | 53.4 | 114.4 | 95.4 |

In some examples, fluid mixtures may be used. For example, a more volatile fluid (lower latent heat of evaporation) may be mixed with water, which has a very high thermal conductivity and heat capacity. The more volatile fluid could drive the working fluid flow by creating vapour, while the water could be the principle heat transfer engine. In other examples, dissolved gases may be used, such as CO2 dissolved in water (though the kinetics and thermodynamics of gas exchange may need to be factored into the working fluid dynamics). Depending on the particular working fluid selected, the dominant mode of heat transfer may be transfer through heating up a liquid phase, or transfer through vapourizing a liquid phase. A more volatile fluid may provide more circulation of the working fluid around or within the heat spreader.

Enhanced Performance for a Laser Array Application

One particular application of the heat spreader described herein is thermal management of an optoelectronic component such as a laser array.

For the analysis, a 16-element SOA array dissipating 10 Watts of power is located in an area of 12 mm×0.5 mm along an edge of a silicon submount that is 200 microns thick. The silicon submount is then attached to a two-phase liquid/vapor heat spreader (such as heat spreader 206) with an assumed effective thermal conductivity of 2000 W/mK. The heat spreader is subsequently mounted on a thermoelectric cooler (TEC) with standard $Al_2O_3$ headers with a thermal conductivity of 12 W/mK. For purposes of illustration this temperature of 45° C. and where the TEC hot side (heat rejection side) is fixed at 65° C. are shown below in Table 3.

In particular, Table 3 shows the results of different thermal management configurations for managing the SOA array using the Marlow RC6-6 TEC. The baseline benchmark (Case 1), which assumes the 10 W of SOA power is distributed uniformly across the silicon submount achieves the lowest temperature differentials and TEC powers of all the cases, which is expected as the uniform heat flux allows the TEC to operate optimally.

The worst performing case is Case 2, which corresponds to a 700 micron silicon submount attached to a standard, off-the-shelf Marlow RC6-6 TEC with $Al_2O_3$ headers, resulting in a 14° C. and 52° C. differential across the SOA array and silicon submount, respectively, and a required TEC power of 43 W to achieve a maximum SOA array temperature of 45° C. The large TEC power requirement is due to the poor heat spreading in the TEC headers, which have a low thermal conductivity of 12 W/mK due to their $Al_2O_3$ composition. This results in the TEC internal couples that are located farther from the SOA array having a much lower temperature, as they only receive a small portion of the heat load relative to couples located closer to the SOA array, while the TEC couples closer to the SOA array receive a much higher heat load. As materials with enhanced thermal conductivity are used within the structure, the temperature differentials and TEC power improve. The best performing

TABLE 3

Different thermal management configurations for cooling a 10 W SOA array using a Marlow RC6-6 thermoelectric cooler as characterized by the temperature differential across the SOA array and silicon submount and the required TEC current and power. Case 1 with a uniform 10 W heat source evenly spread across the submount is considered the ideal benchmark as this configuration allows the TEC to function with the lowest power.

| Case | Description | $T_{hot}$ [° C.] | $T_{SOA, max}$ [° C.] | $DT_{SOA}$ [° C.] | $DT_{Si, sub}$ [° C.] | TEC current [A] | TEC power [W] |
|---|---|---|---|---|---|---|---|
| 1 | Base RC6-6 TEC with spread 10 W heat source | 65 | 45 | <0.2 | <0.2 | 1.9 | 7 |
| 2 | Case 1 + local heat source (12 mm × 0.5 mm) | 65 | 45 | 14 | 52 | 5.1 | 43 |
| 3 | Case 2 + AlN TEC headers | 65 | 45 | 9 | 28 | 3 | 16.1 |
| 4 | Case 3 + 1.5 mm AlN heat spreader | 65 | 45 | 7 | 20 | 2.6 | 12.4 |
| 5 | Case 1 + 1.5 mm AlN heat spreader | 65 | 45 | 8 | 23 | 2.9 | 15.2 |
| 6 | Case 1 + 2 mm Si submount | 65 | 45 | 11 | 30 | 3.23 | 18.6 |
| 7 | Case 1 + 2000 W/mK spreader and 0.2 mm Si submount | 65 | 45 | <3 | 5 | 2.03 | 7.9 | analysis considers a Marlow RC6-6 thermoelectric cooler.

A comparative (benchmark) case attaches the silicon submount to a 1.5 mm thick AlN heat spreader (with thermal conductivity of 170 W/mK) which is mounted on a Marlow RC6-6 TEC with AlN headers. In this comparative example, which relies purely on solid state conduction (as was discussed with reference to FIG. 1A and FIG. 1B), the silicon submount is 700 microns thick.

Results of ANSYS ICEPak finite volume simulations for 10 W of SOA array power and with a TEC electrical current that is chosen in order to achieve a maximum SOA array solid state conduction case is Case 4, where a significant amount of AlN is used, both as part of the 1.5 mm AlN heat spreader and the TEC headers.

Finally, the best performing case relative to the benchmark (Case 1), corresponds to Case 7, which incorporates the two-phase heat spreader comprising an oscillating heat pipe discussed herein. Here, the TEC power and the temperature differentials across the array and submount are the lowest of Cases 2 through 7, with the TEC power being only 13% larger than the benchmark Case 1. The results of Table 3 thus illustrate the importance of heat spreading using an OHP, as described herein, on TEC power usage and device temperature uniformity. With reference to Case 6, it can also be seen that simply increasing the thickness of the substrate does not always improve heat spreading.

For example, with Case 4 the TEC requires 12.4 W of power to achieve a SOA array maximum temperature of 45° C., and has a corresponding temperature variation across the silicon submount of 20° C. In contrast, for the case using the two-phase liquid/vapor heat spreader (Case 7), the TEC requires 7.9 W of power to achieve a SOA array maximum temperature of 45° C., and has a corresponding temperature variation across the silicon submount of 5° C.; these are 36% and 75% reductions, respectively, in TEC power and xo temperature variation. This illustrates the significant advantages that the two-phase liquid/vapor heat spreader can provide for thermal management of electronic and optoelectronic devices, namely reducing cooling power requirements and decreasing temperature non-uniformities.

In the above discussion, the heat spreader 206 is described as being a separate structure that sits between the component 204 and the TEC 210b. In other embodiments, the heat spreader could be directly integrated with the component (for example through direct integration into the silicon submount), or into the TEC (for example, into one or both of the ceramic headers of the TEC). Such an approach could simplify the assembly of the overall device 200, as there would be one less layer needed in the stack-up, and would remove one thermal interface layer 208 from the structure of FIG. 2A, 2B or 2C (which would simplify the solder layer stack-up). Incorporation of the heat spreader 206 into the ceramic headers of the TEC, for example, with AlN, could result in substantial performance, device integration and packaging benefits for using TECs in other applications.

Figure 9B:
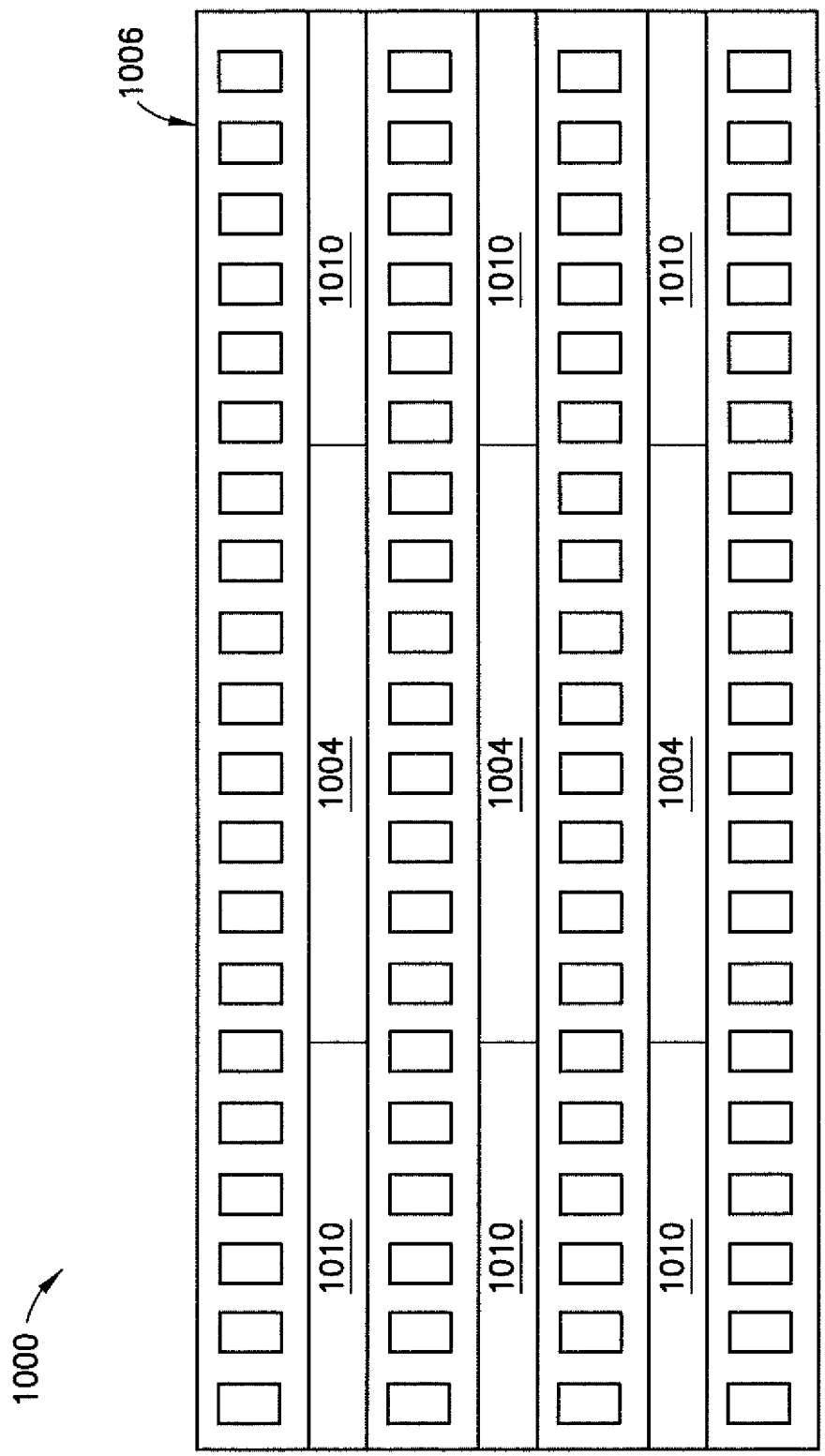
Figure 9E:
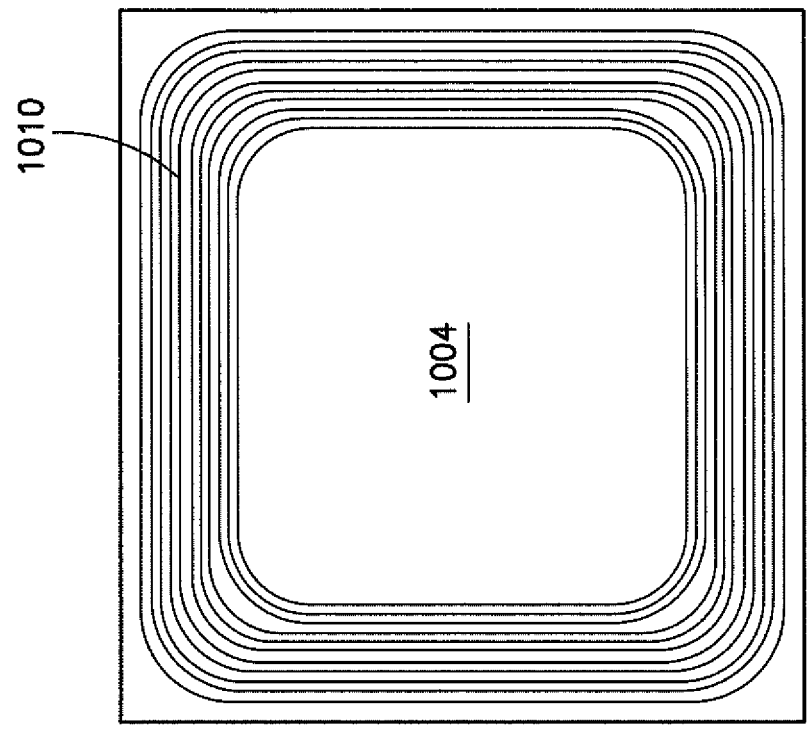

Another example implementation of the use of a heat spreader (such as heat spreader 206 described above) to cool an electronic component can be seen with reference to FIG. 9A and FIG. 9B. In particular, an approach to cooling a device comprising a three-dimensional integrated can be provided.

With reference to FIG. 9A, it can be seen that one approach to cooling a three-dimensional circuit may be to provide semiconductor components 1004 in layers, with a heat spreader 1006 comprising an oscillating heat pipe arranged between respective layers of semiconductor components. In other words, the device 1000 may comprise a stack of alternating layers of semiconductor component 1004 and heat spreader 1006. Heat spreader 1006 may be implemented in any suitable manner, using any of the examples discussed above with respect of heat spreader 206. However, it can be understand that with an alternating structure as shown in FIG. 9A, it may be difficult to effectively remove the heat circulating within the oscillating heat pipes of the heat spreaders 1006 from the system, particularly the heat from the heat spreaders located in the middle of the stack which instead may be spread around the device 1006. As such, the efficacy of cooling of the semiconductor components 1004 may be reduced.

With reference to FIG. 9B, one approach to address this can be to provide at least one heat sink 1010 arranged around each of the semiconductor components 1004. In other words, device 1000 comprises a three-dimensional integrated circuit, the three-dimensional circuit comprising one or more semiconductor or chip layers, each layer comprising at least one chip or semiconductor component 1004. At least one heat sink 1010 is arranged in the semiconductor or chip layer, at least partially around the component 1004. At least one heat spreader 1006 is provided, each heat spreader 1006 arranged to be in thermal communication with the at least one heat sink 1010 and the component 1004 of each adjacent chip or semiconductor layer. In some examples the one or more semiconductor or chip layers comprise a plurality of layers and the one or more heat spreaders comprise a plurality of heat spreaders. The plurality of semiconductor or chip layers can then be alternately arranged with the plurality of heat spreaders 1006 in a stack.

Figure 3:
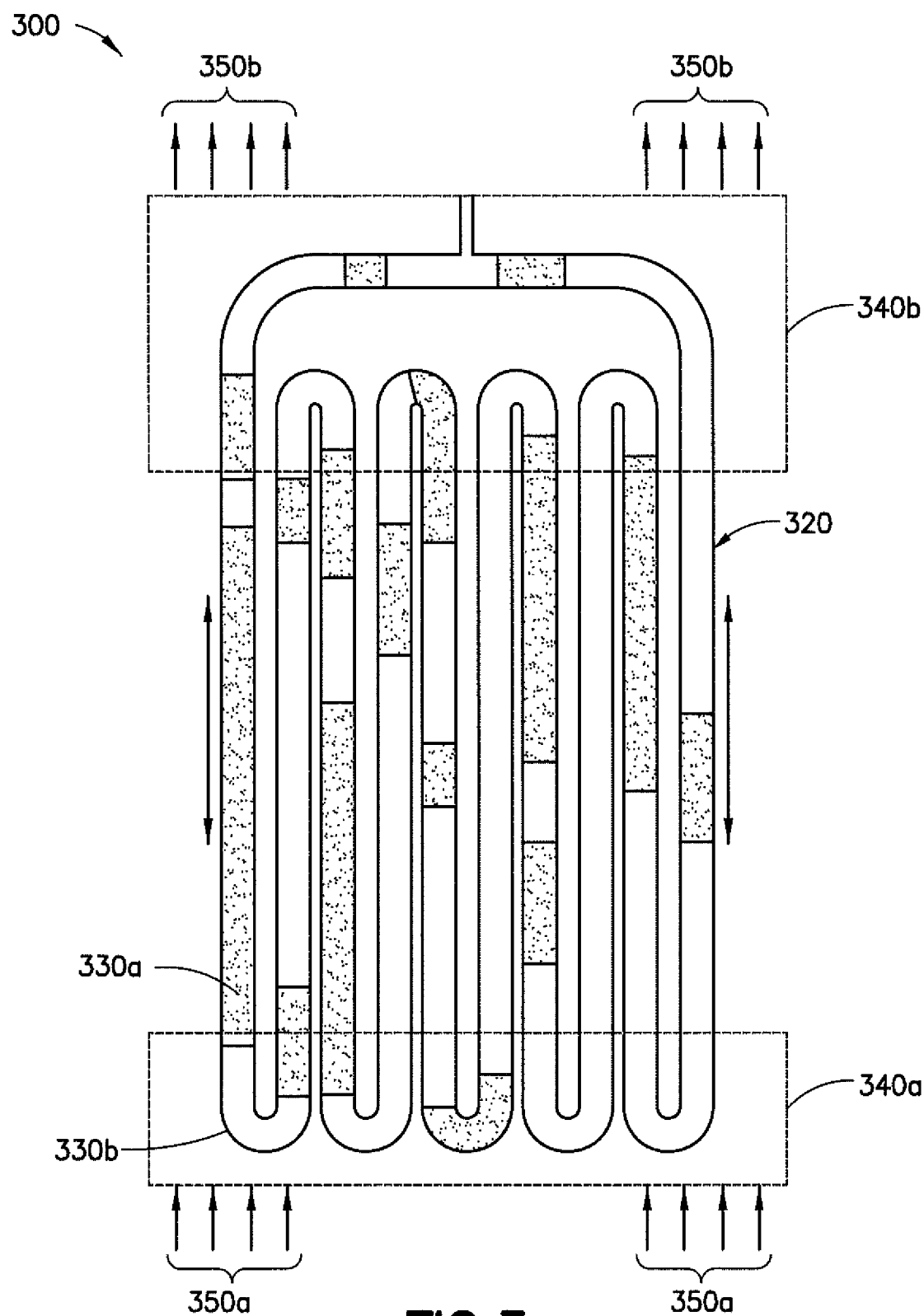
FIG. 3 is a schematic top-plan view of an example oscillating heat pipe.

By providing alternating layers in this way, heat can be transferred from the component 1004 and spread within the heat spreader 1006 via the at least one oscillating heat pipe provided or formed within the heat spreader (each oscillating heat pipe comprising a plurality of interconnected channels containing a working fluid, as discussed with reference to FIG. 3). Heat can be then be transferred (removed) from the heat spreaders 1006 into the heat sinks 1obo. By placing the heat sinks 1010 around (or, in some examples, partially around) the components to be cooled 1004, a more compact device may be provided which facilitates improved heat removal from the components 1004.

In the particular example shown in FIGS. 9C (side view) and 9D (top view) and further 9E (top view of a different section), each heat sink 1010 is arranged to be disposed in the chip or semiconductor layer and fully surround the components 1004. The heat sinks 1010 each comprise a series of microchannels through which a cooling fluid is pumped (by a pump associated with the device, not shown) to remove heat from the device 1000 and provide cooling of the components 1004. In other words, each heat sink comprises a plurality of microchannels, the plurality of microchannels disposed in the chip or semiconductor layer and arranged to circulate the cooling fluid around the component 1004. The cooling fluid may remove heat from the component 1004 itself, and from the heat spreaders 1006 which are adjacent and in thermal communication with it. The heat sinks 1010 may also comprise a finned structure (not shown) to add in heat transfer into the cooling fluid; the fins may be formed by the walls forming the plurality of microchannels and/or may be provided separate to the microchannels of the heat sink.

Figure 9D:
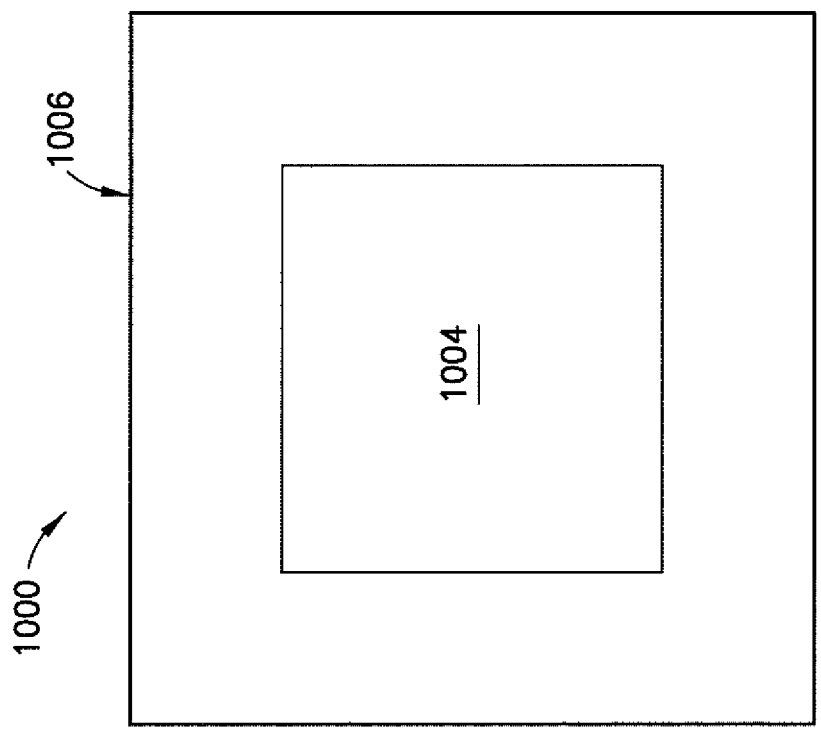

In FIG. 9D, which shows the heat spreader 1006 with a semiconductor layer comprising component 1004 disposed on top, the heat sink 1010 shown separated from the semiconductor layer to illustrate how the heat sink can be arranged around the component 1004. In particular, the microchannels through which the cooling fluid is pumped (the pump and inlet/outlet channels are not shown) can be arranged to circulate around the component 1004. This can allow for increased heat removal from the device whilst keeping the device relatively compact. In other examples (not shown), the heat sink 1010 may not fully surround the component 1004.

Figure 10:
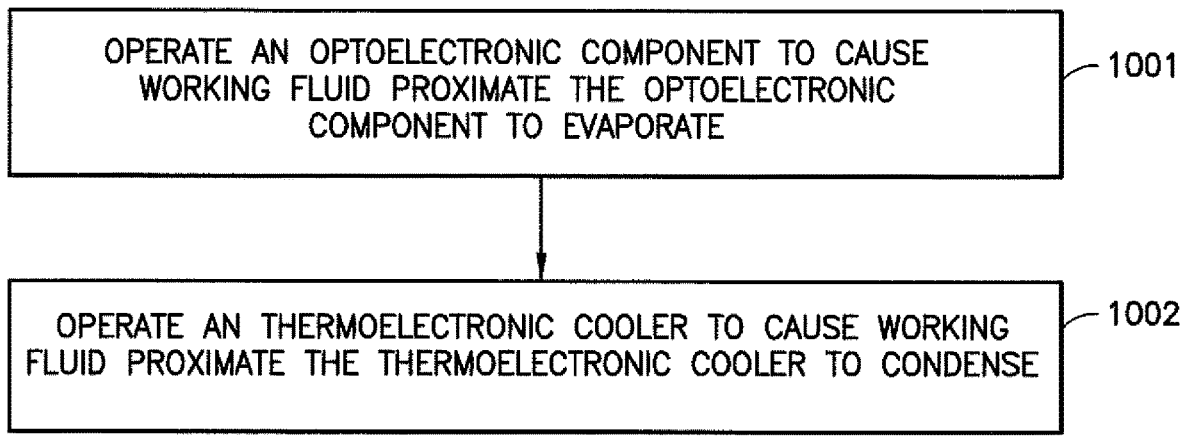
FIG. 10 is a flow diagram processing operations for cooling a device according to some example embodiments.

FIG. 10 is a flow diagram showing operations for cooling a device according to some example embodiments. The device can comprise: a heat spreader having a first side and a second side opposite the first side, the heat spreader comprising at least one oscillating heat pipe arranged between the first side and the second side, each oscillating heat pipe comprising a plurality of interconnected channels comprising a working fluid; at least one optoelectronic component coupled to the first side of the heat spreader; and a thermoelectric cooler, wherein a cold side of the thermoelectric cooler is coupled to the second side of the heat spreader.

A first operation 1001 may comprise operating the optoelectronic component, wherein heat generated by operation of the optoelectronic component causes a portion of the working fluid disposed within the interconnected channels and proximate the optoelectronic component to evaporate.

A second operation 1002 may comprise operating the thermoelectric cooler to draw heat from the cold side to a hot side of the thermoelectric cooler, thereby to cause a portion of the working fluid disposed within the interconnected channels and proximate the cold side of the thermoelectric cooler to condense. The evaporation and condensation of the working fluid causes circulation of the working fluid within the oscillating heat pipe to transfer heat from the optoelectronic component to the thermoelectric cooler to cool the device.

In other words, the first operation 1001 is to operate an optoelectronic component to cause working fluid proximate the optoelectronic component to evaporate. The second operation 1002 is to operate a thermoelectric cooler to cause working fluid proximate the thermoelectric cooler to condense. Thereby, a device comprising the optoelectronic component and the thermoelectric cooler may be cooled by circulation of the working fluid around an oscillating heat pipe of the device.

It will be understood that in some operational cases, for example when the ambient temperature is low relative to typical operational temperatures (e.g. if the device needs to be operated outside or in a cooled environment), the thermoelectric cooler coupled to the heat spreader may operate in a heating mode. For example, rather that drawing heat from the cold side to the hot side as discussed above, a polarity of the operating current of the TEC may be reversed in order that heat is drawn from the 'hot' side to the 'cold' side of the thermoelectric cooler.

Figure 11:
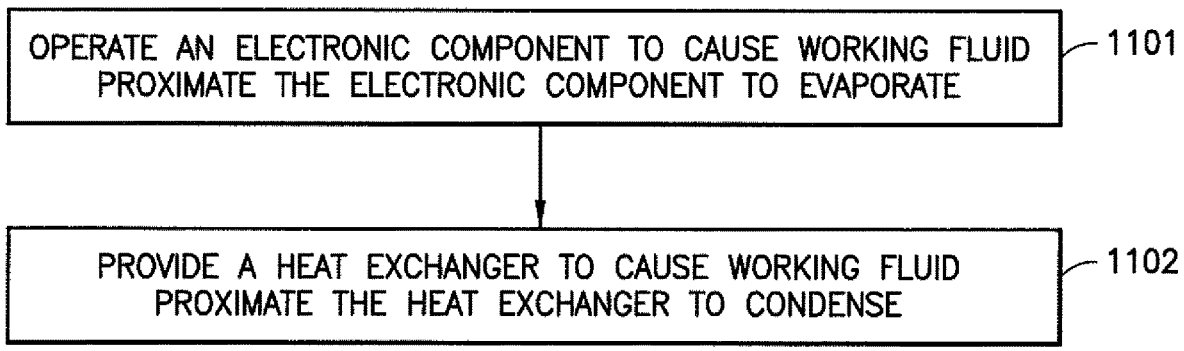
FIG. 11 is a flow diagram processing operations for cooling a device according to some example embodiments.

FIG. 11 is a flow diagram showing operations for cooling a device according to some example embodiments. The device can comprise: a heat spreader having a first side and a second side opposite the first side, the heat spreader comprising at least one oscillating heat pipe, each oscillating heat pipe comprising a plurality of interconnected channels comprising a working fluid, the heat spreader further comprising one or more heat exchange features; at least one electronic component coupled to the first side of the heat spreader; and a heat exchanger coupled to the second side of the heat spreader.

A first operation 1101 may comprise operating the electronic component, wherein heat generated by operation of the electronic component causes a portion of the working fluid disposed within the interconnected channels and proximate the electronic component to evaporate.

A second operation 1102 may comprise providing the heat exchanger to draw heat from the first side of the heat spreader to the second side of the heat spreader, thereby to cause a portion of the working fluid disposed within the interconnected channels and proximate the second side of the heat spreader to condense. The evaporation and condensation of the working fluid causes circulation of the working fluid within the oscillating heat pipe to transfer heat from the electronic component to the heat exchanger to cool the device.

In other words, the first operation 1101 is to operate an electronic component to cause working fluid proximate the electronic component to evaporate. The second operation 1102 is to provide a heat exchanger to cause working fluid proximate the heat exchanger to condense. Thereby, a device comprising the electronic component and the heat exchanger may be cooled by circulation of the working fluid around an oscillating heat pipe of the device.

In some optional examples, a third operation can be provided in which one or more thermoelectric couples provided between two OHPs is driven in accordance with a time varying current or a time varying voltage. This time varying function may be predetermined, or may be controlled based on one or more measurements. In some examples, the time varying function may be controlled based on measurements from one or more temperature sensors. By modulating or controlling the operation of the thermocouple(s), a time varying heating and cooling profile can be provided to drive the fluid around the OHP loop. It will also be understood that, in some examples, one or more thermoelectric couple(s) may be provided with a single OHP; in such an implementation, one side of the thermoelectric couple can be coupled to a heat sink, which could act as either a heat sink or a heat source, and the thermoelectric couple can be used to grow/condense vapour bubbles in the OHP loop by adding/removing heat from the OHP loop at select times. Improved circulation of the working fluid, and therefore improved heat transfer, may thus be provided.

If not otherwise stated or otherwise made clear from the context, the statement that two entities are different means that they perform different functions. It does not necessarily mean that they are based on different hardware. That is, each of the entities described in the present description may be based on a different hardware, or some or all of the entities may be based on the same hardware. It does not necessarily mean that they are based on different software. That is, each of the entities described in the present description may be based on different software, or some or all of the entities may be based on the same software. Each of the entities described in the present description may be embodied in the cloud.

Implementations of any of the above described blocks, apparatuses, systems, techniques or methods include, as non-limiting examples, implementations as hardware, software, firmware, special purpose circuits or logic, general purpose hardware or controller or other computing devices, or some combination thereof. Some embodiments may be implemented in the cloud. It is to be understood that what is described above is what is presently considered the preferred embodiments. However, it should be noted that the description of the preferred embodiments is given by way of example only and that various modifications may be made without departing from the scope as defined by the appended claims.

The invention claimed is:
1. A device, comprising:
a heat spreader having a first side and a second side opposite the first side, the heat spreader comprising at least one oscillating heat pipe arranged between the first side and the second side, at least one of the at least one oscillating heat pipe comprising a plurality of interconnected channels comprising a working fluid, the interconnected channels comprising at least one valve comprising a gradual change of a cross sectional diameter of one or more of the plurality of channels and a wick extending lengthwise in the at least one valve through the gradual change of cross sectional diameter in a direction of flow of the working fluid;
at least one optoelectronic component coupled to the first side of the heat spreader; and
at least one thermoelectric cooler, wherein a cold side of the at least one thermoelectric cooler is coupled to the second side of the heat spreader.
2. The device of claim 1, the heat spreader further comprising one or more heat exchange features.

3. The device of claim 2, the at least one of the at least one oscillating heat pipe further comprising one or more structures provided within the plurality of channels, wherein the one or more heat exchange features comprise the one or more structures.

4. The device of claim 3, wherein the one or more structures comprise one or more protrusions extending into one or more of the plurality of channels in a direction from the first side to the second side.

5. The device of claim 4, wherein the protrusions comprise one or more series of pillars.

6. The device of claim 3, wherein the one or more structures comprise one or more splitters configured to split one or more of the plurality of channels.

7. The device of claim 3, wherein the one or more structures comprise at least one of a contraction or an expansion of a diameter of one or more of the plurality of channels.

8. The device of claim 3, wherein the heat spreader comprises a heated region proximate the at least one optoelectronic component, a cooled region proximate the thermoelectric cooler and an adiabatic region between the heated and cooled regions,
wherein the one or more structures are provided in the heated region of the heat spreader.

9. The device of claim 1, further comprising a heat sink coupled to a hot side of the at least one thermoelectric cooler.

10. The device of claim 1, wherein the optoelectronic device comprises at least one of: a laser, a semiconductor optical amplifier, a modulator, or a laser array.

11. The device of claim 2, wherein the heat spreader comprises two oscillating heat pipes arranged adjacent to one another,
wherein the one or more heat exchange features comprise a thermoelectric coupler configured to exchange heat between the two adjacent oscillating heat pipes to drive the working fluid around the respective oscillating heat pipes.

12. The device of claim 2,
wherein the heat spreader comprises a first plate and second plate, the at least one oscillating heat pipe formed between the first and second plates,
wherein the one or more heat exchange features comprise one of the first and second plates being formed of a thermally conductive material and the other of the first and second plates being formed of a thermally insulating material.

13. The device of claim 12,
wherein the thermally conductive material comprises one or more of: silicon, silicon carbide, aluminium nitride, or aluminium oxide; and
wherein the thermally insulating material comprises a glass.

14. A method of cooling the device of claim 1, the method comprising:
operating the optoelectronic component, wherein heat generated by operation of the optoelectronic component causes a portion of the working fluid disposed within the interconnected channels comprising the at least one valve comprising the gradual change of the cross sectional diameter of the interconnected channels and the wick extending lengthwise in the at least one valve through the gradual change of cross sectional diameter in the direction of flow of the working fluid and proximate the optoelectronic component to absorb heat;
operating the thermoelectric cooler to draw heat from the cold side of the thermoelectric cooler to a hot side of the thermoelectric cooler, thereby to cause a portion of the working fluid disposed within the interconnected channels and proximate the cold side of the thermoelectric cooler to reject heat,
whereby the absorption and rejection of heat by the working fluid causes circulation of the working fluid within the at least one oscillating heat pipe to transfer heat from the at least one optoelectronic component to the thermoelectric cooler to cool the device.

15. The method of claim 14, further comprising providing one or more structures within the plurality of channels, wherein during the circulation of the working fluid the working fluid circulates around the one or more structures.

16. The device of claim 13, further comprising one or more thermally conducting vias arranged through the glass.

* * * * *